(12) United States Patent
Botula et al.

(10) Patent No.: US 8,026,131 B2
(45) Date of Patent: Sep. 27, 2011

(54) SOI RADIO FREQUENCY SWITCH FOR REDUCING HIGH FREQUENCY HARMONICS

(75) Inventors: Alan B. Botula, Essex Junction, VT (US); Edward J. Nowak, Essex Junction, VT (US); James A. Slinkman, Montpelier, VT (US)

(73) Assignee: International Business Machines Corporation, Armonk, NY (US)

( * ) Notice: Subject to any disclaimer, the term of this patent is extended or adjusted under 35 U.S.C. 154(b) by 139 days.

(21) Appl. No.: 12/342,488

(22) Filed: Dec. 23, 2008

(65) Prior Publication Data
US 2010/0156510 A1 Jun. 24, 2010

(51) Int. Cl.
*H01L 21/00* (2006.01)
*H01L 27/01* (2006.01)

(52) U.S. Cl. ......... 438/151; 438/164; 257/347; 257/350
(58) Field of Classification Search .................. 438/151, 438/155, 164; 257/347, 349, 350
See application file for complete search history.

(56) References Cited

U.S. PATENT DOCUMENTS

| | | | |
|---|---|---|---|
| 6,337,253 B1 * | 1/2002 | Davari et al. .................. | 438/393 |
| 6,437,405 B2 * | 8/2002 | Kim ............................... | 257/347 |
| 6,562,666 B1 | 5/2003 | Park et al. | |
| 7,123,898 B2 | 10/2006 | Burgener et al. | |
| 7,205,190 B2 | 4/2007 | Okihara | |
| 7,709,926 B2 * | 5/2010 | Abadeer et al. ................ | 257/510 |
| 7,718,503 B2 * | 5/2010 | Pellela et al. .................. | 438/396 |
| 7,741,164 B2 * | 6/2010 | Pelella ........................... | 438/155 |
| 7,791,160 B2 * | 9/2010 | Kim et al. ...................... | 257/499 |
| 2007/0018247 A1 | 1/2007 | Brindle et al. | |

\* cited by examiner

*Primary Examiner* — Kevin M Picardat
(74) *Attorney, Agent, or Firm* — Scully, Scott, Murphy & Presser, P.C.; Anthony J. Canale

(57) ABSTRACT

First doped semiconductor regions having the same type doping as a bottom semiconductor layer and second doped semiconductor regions having an opposite type doping are formed directly underneath a buried insulator layer of a semiconductor-on-insulator (SOI) substrate. The first doped semiconductor regions and the second doped semiconductor regions are electrically grounded or forward-biased relative to the bottom semiconductor layer at a voltage that is insufficient to cause excessive current due to forward-biased injection of minority carriers into the bottom semiconductor layer, i.e., at a potential difference not exceeding 0.6 V to 0.8V. The electrical charges formed in an induced charge layer by the electrical signal in semiconductor devices on the top semiconductor layer are drained through electrical contacts connected to the first and second doped semiconductor regions, thereby reducing of harmonic signals in the semiconductor devices above and enhancing the performance of the semiconductor devices as a radio-frequency (RF) switch.

25 Claims, 21 Drawing Sheets

SOI RADIO FREQUENCY SWITCH FOR REDUCING HIGH FREQUENCY HARMONICS

FIELD OF THE INVENTION

The present invention relates to semiconductor structures, and particularly to a semiconductor structure including a radio frequency switch on a semiconductor-on-insulator (SOI) substrate, methods of manufacturing the same, and methods of operating the same.

BACKGROUND OF THE INVENTION

Semiconductor devices such as field effect transistors are employed as a switching device for radio frequency (RF) signals in analog and RF applications. Semiconductor-on-insulator (SOI) substrates are typically employed for such applications since parasitic coupling between devices through the substrate is reduced due to the low dielectric constant of a buried insulator layer. For example, the dielectric constant of silicon, which comprises the entirety of the substrate of a bulk silicon substrate, is 11.7 in gigahertz ranges. In contrast, the dielectric constant of silicon oxide, which isolates a top semiconductor layer containing devices from a handle substrate, is 3.9. By providing the buried insulator layer, which has a dielectric constant less than the dielectric constant of a semiconductor material in a bulk substrate, the SOI substrate reduces capacitive coupling between an individual semiconductor device and the substrate, and consequently, reduces secondary capacitive coupling between semiconductor devices through the substrate.

However, even with the use of an SOI substrate, the secondary capacitive coupling of electrical signals between semiconductor devices is significant due to the high frequency range employed in the radio frequency applications, which may be, for example, from 900 MHz to 1.8 GHz, and may include even higher frequency ranges. This is because the capacitive coupling between electrical components increases linearly with frequency.

For a radio frequency (RF) switch formed on an SOI substrate, the semiconductor devices comprising the RF switch and the signal processing units in a top semiconductor layer are capacitively coupled through a buried insulator layer to a bottom semiconductor layer. Even if the semiconductor devices in the top semiconductor layer employ a power supply voltage from 3 V to 9V, the transient signals and signal reflections in an antenna circuitry may increase the actual voltage in the top semiconductor layer up to 30V. Such voltage conditions induce a significant capacitive coupling between the semiconductor devices subjected to such high voltage signals and an induced charge layer within an upper portion of the bottom semiconductor layer, which changes in thickness and charge polarity at the frequency of the RF signal in the semiconductor devices in the top semiconductor layer. The induced charge layer capacitively couples with other semiconductor devices in the top semiconductor layer including the semiconductor devices that an RF switch is supposed to isolate electrically. The spurious capacitive coupling between the induced charge layer in the bottom semiconductor layer and the other semiconductor devices provides a secondary capacitive coupling, which is a parasitic coupling that reduces the effectiveness of the RF switch. In this case, the RF signal is applied to the other semiconductor devices through the secondary capacitive coupling although the RF switch is turned off.

To enhance the performance of an RF switch, reduction of signal coupling between the bottom semiconductor layer and the semiconductor devices in the top semiconductor layer is desirable. Further, reduction of harmonic generation through the signal coupling is desirable to enhance the performance of the RF switch.

SUMMARY OF THE INVENTION

The present invention provides a set of electrical contacts through shallow trench isolation structures and a buried insulator layer that removes electrical charges in an induced charge layer at a top portion of a bottom semiconductor layer for reducing harmonics in semiconductor devices located above, methods of manufacturing the same, and methods of operating the same.

First doped semiconductor regions having the same type doping as a bottom semiconductor layer and second doped semiconductor regions having an opposite type doping are formed directly underneath a buried insulator layer of a semiconductor-on-insulator (SOI) substrate. The first doped semiconductor regions and the second doped semiconductor regions are electrically grounded or forward-biased relative to the bottom semiconductor layer at a voltage that is insufficient to cause excessive current due to forward-biased injection of minority carriers into the bottom semiconductor layer, i.e., at a potential difference not exceeding 0.6 V to 0.8 V. The electrical charges formed in an induced charge layer by the electrical signal in semiconductor devices on the top semiconductor layer are drained through electrical contacts connected to the first and second doped semiconductor regions, thereby reducing harmonic signals in the semiconductor devices above and enhancing the performance of the semiconductor devices as a radio-frequency (RF) switch. In particular, the substrate is nearly always in accumulation, or in inversion, and thus presents a relatively constant capacitance and field shield, inhibiting electric field lines between elements in the top silicon. A design structure for the semiconductor structure is also provided.

According to an aspect of the present invention, a method of forming a semiconductor structure is provided, which includes: forming at least one field effect transistor on a top semiconductor layer of a semiconductor-on-insulator (SOI) substrate including a bottom semiconductor layer having a doping of a first conductivity type; forming a shallow trench isolation structure in the top semiconductor layer, wherein the shallow trench isolation structure laterally abuts and surrounds the at least one field effect transistor; forming a first doped semiconductor region in the bottom semiconductor layer, wherein the first doped semiconductor region abuts the buried insulator layer and has a doping of the first conductivity type; and forming a second doped semiconductor region in the bottom semiconductor layer, wherein the second doped semiconductor region abuts the buried insulator layer and has a doping of the first conductivity type, wherein the second conductivity type is the opposite of the first conductivity type, and wherein the first and second doped semiconductor region are electrically connected through at least one metal interconnect structure located above the SOI substrate.

According to another aspect of the present invention, a method of operating a semiconductor device is provided. The method of operation includes: providing a semiconductor device containing: a semiconductor-on-insulator (SOI) substrate including a top semiconductor layer, a buried insulator layer, and a bottom semiconductor layer having a doping of a first conductivity type; at least one field effect transistor located on the top semiconductor layer; a shallow trench isolation structure laterally abutting the at least one field effect transistor; a first doped semiconductor region embedded in the bottom semiconductor layer and abutting the buried insulator layer and having a doping of the first conductivity type; and a second doped semiconductor region embedded in the bottom semiconductor layer and abutting the buried insulator layer and having a doping of a second conductivity type, wherein the second conductivity type is the opposite of the first conductivity type; applying a radio frequency (RF) signal to the at least one field effect transistor, wherein an induced charge layer is formed directly underneath the buried insulator layer; and electrically biasing the first and second doped semiconductor regions at a same voltage.

According to yet another aspect of the present invention, a semiconductor structure is provided. The semiconductor structure includes: a semiconductor-on-insulator (SOI) substrate including a top semiconductor layer, a buried insulator layer, and a bottom semiconductor layer having a doping of a first conductivity type; at least one field effect transistor located on the top semiconductor layer; a shallow trench isolation structure laterally abutting the at least one field effect transistor; a first doped semiconductor region embedded in the bottom semiconductor layer and abutting the buried insulator layer and having a doping of the first conductivity type; and a second doped semiconductor region embedded in the bottom semiconductor layer and abutting the buried insulator layer and having a doping of a second conductivity type, wherein the second conductivity type is the opposite of the first conductivity type, and wherein the first and second doped semiconductor region are electrically biased at a same voltage.

According to still another aspect of the present invention, a design structure embodied in a machine readable medium for designing, manufacturing, or testing a design for a semiconductor structure is provided. The design structure includes: a first data representing a semiconductor-on-insulator (SOI) substrate including a top semiconductor layer, a buried insulator layer, and a bottom semiconductor layer having a doping of a first conductivity type; a second data representing at least one field effect transistor located on the top semiconductor layer; a third data representing a shallow trench isolation structure laterally abutting the at least one field effect transistor; a fourth data representing a first doped semiconductor region embedded in the bottom semiconductor layer and abutting the buried insulator layer and having a doping of the first conductivity type; and a fifth data representing a second doped semiconductor region embedded in the bottom semiconductor layer and abutting the buried insulator layer and having a doping of a second conductivity type, wherein the second conductivity type is the opposite of the first conductivity type, wherein the first and second doped semiconductor region are electrically biased at a same voltage.

BRIEF DESCRIPTION OF THE DRAWINGS

FIGS. 1-3, 5, 7, and 9 are sequential vertical cross-sectional views of the first exemplary semiconductor structure. FIG. 4 is a horizontal cross-sectional view along the plane X-X' of FIG. 3. FIG. 3 is a vertical cross-sectional view along the plane Z-Z' of FIG. 4. FIG. 6 is a horizontal cross-sectional view along the plane X-X' of FIG. 5. FIG. 5 is a vertical cross-sectional view along the plane Z-Z' of FIG. 6. FIG. 8 is a top-down view of FIG. 7 in which a middle-of-line dielectric layer is removed for clarity. FIG. 10 is a top-down view of FIG. 10.

FIG. 12 is a horizontal cross-sectional view along the plane A-A' in FIG. 14. FIG. FIG. 13 is a horizontal cross-sectional view along the plane B-B' in FIG. 14. FIG. 14 is a vertical cross-sectional view.

FIGS. 15 and 16 are horizontal cross-sectional views of the fifth exemplary semiconductor structure along the planes corresponding to the planes A-A' and B-B', respectively, in FIG. 14.

DETAILED DESCRIPTION OF THE INVENTION

Figure 1:
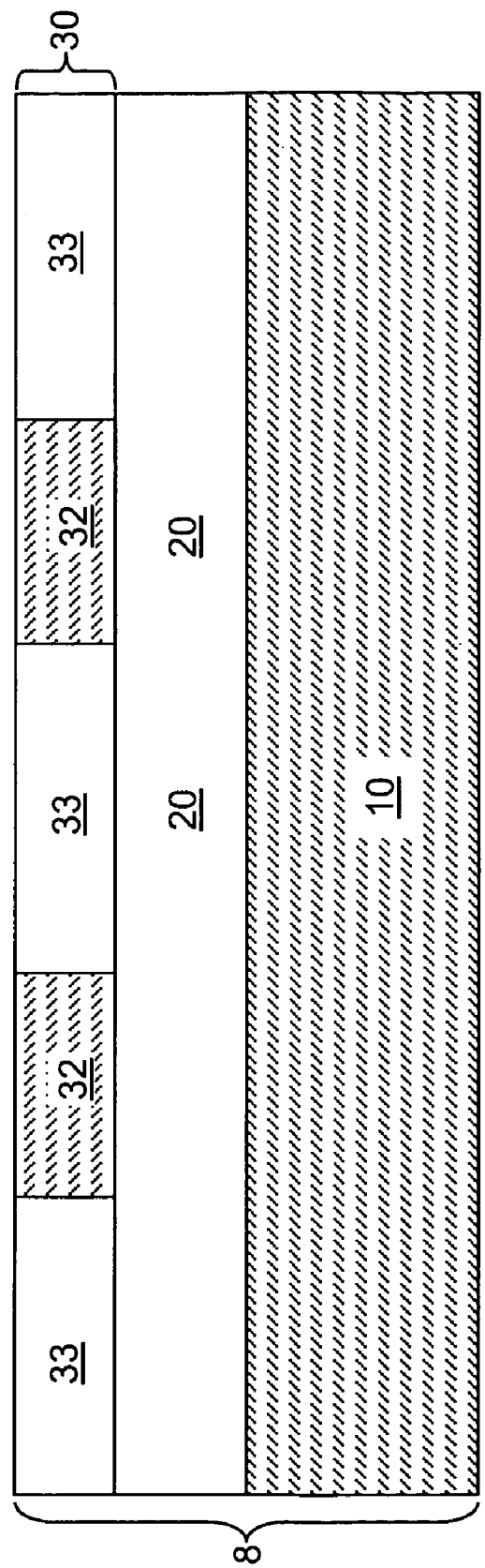
FIGS. 1-10 are various views of a first exemplary semiconductor structure according to a first embodiment of the present invention.

As stated above, the present invention relates to a semiconductor structure including a radio frequency switch on a semiconductor-on-insulator (SOI) substrate, methods of manufacturing the same, and methods of operating the same, which are described herein with accompanying figures. The drawings are not necessarily drawn to scale.

As used herein, radio frequency (RF) denotes a frequency of electromagnetic wave within the range of 3 Hz to 300 GHz. Radio frequency corresponds to the frequency of electromagnetic wave that is used to produce and detect radio waves. Radio frequency includes very high frequency (VHF), ultra high frequency (UHF), super high frequency (SHF), and extremely high frequency (EHF).

As used herein, very high frequency (VHF) refers to a frequency in the range from 30 MHz to 300 MHz. VHF is used, among others, for frequency modulation (FM) broadcasting. Ultra high frequency (UHF) refers to a frequency in the range from 300 MHz to 3 GHz. UHF is used, among others, for mobile telephones, wireless networks, and microwave ovens. Super high frequency (SHF) refers to a frequency in the range from 3 GHz to 30 GHz. SHF is used, among others, for wireless networking, radar, and satellite links. Extremely high frequency (EHF) refers to a frequency in the range from 30 GHz to 300 GHz. EHF produces millimeter waves having a wavelength from 1 mm to 10 mm, and is used, among others, for data links and remote sensing.

The term "accumulation region" refers to a doped semiconductor region in which the majority charge carriers accumulate due to external voltage bias. A p-doped semiconductor region is in accumulation mode if excess holes, which are the majority charge carriers in the p-doped semiconductor region, accumulate in the p-doped semiconductor region by an external negative voltage so that the p-doped semiconductor region has a net positive charge. An n-doped semiconductor region is in accumulation mode if excess electrons, which are the majority charge carriers in the n-doped semiconductor region, accumulate in the n-doped semiconductor region by an external positive voltage so that the n-doped semiconductor region has a net negative charge.

The term "depletion region" refers to a doped semiconductor region from which the majority charge carriers are repelled due to external voltage bias while minority charge carriers do not accumulate so that majority charge carriers and minority charge carriers are depleted from the doped semiconductor region. A p-doped semiconductor region is in depletion mode if holes, which are the majority charge carriers in the p-doped semiconductor region, are depleted in the p-doped semiconductor region by a weak external positive voltage so that the p-doped semiconductor region has a net negative charge. An n-doped semiconductor region is in depletion mode if electrons, which are the majority charge carriers in the n-doped semiconductor region, are depleted in the n-doped semiconductor region by a weak external negative voltage so that the n-doped semiconductor region has a net positive charge.

The term "inversion region" refers to a doped semiconductor region in which minority charge carriers accumulate. Typically, an inversion region forms at a semiconductor surface in close proximity to a strong external voltage. A p-doped semiconductor region is in inversion mode if electrons, which are the minority charge carriers in the p-doped semiconductor region, accumulate in the p-doped semiconductor region by a strong external positive voltage so that the p-doped semiconductor region has a net negative charge. An n-doped semiconductor region is in inversion mode if holes, which are the minority charge carriers in the n-doped semiconductor region, accumulate in the n-doped semiconductor region by a strong external negative voltage so that the n-doped semiconductor region has a net positive charge.

Referring to FIG. 1, a first exemplary semiconductor structure according to a first embodiment of the present invention comprises a semiconductor substrate 8. The semiconductor substrate 8 is a semiconductor-on-insulator (SOI) substrate that includes a bottom semiconductor layer 10, a buried insulator layer 20, and a top semiconductor layer 30. The top semiconductor layer 30 includes at least one top semiconductor portion 32 and a shallow trench isolation structure 33. At least one pad dielectric layer (not shown) comprising at least one dielectric material, such as silicon nitride, may be provided on a top surface of the top semiconductor layer 30 to facilitate formation of lower conductive vias by planarization in subsequent processing steps.

Each of the bottom semiconductor layer 10 and the at least one top semiconductor portion 32 comprises a semiconductor material such as silicon, a silicon germanium alloy region, silicon, germanium, a silicon-germanium alloy region, a silicon carbon alloy region, a silicon-germanium-carbon alloy region, gallium arsenide, indium arsenide, indium gallium arsenide, indium phosphide, lead sulfide, other III-V compound semiconductor materials, and II-VI compound semiconductor materials. The semiconductor material of the bottom semiconductor layer 10 and the at least one top semiconductor portion 32 may be the same, or different. Typically, each of the bottom semiconductor layer 10 and the at least one top semiconductor portion 32 comprises a single crystalline semiconductor material. For example, the single crystalline semiconductor material may be silicon.

The bottom semiconductor layer 10 has a resistivity greater than 5 Ohms-cm, which includes, for example, p-doped single crystalline silicon having p-type dopants at an atomic concentration less than $2.0 \times 10^{15}/cm^3$ or n-doped single crystalline silicon having n-type dopants at an atomic concentration less than $1.0 \times 10^{15}/cm^3$. Preferably, the bottom semiconductor layer 10 has a resistivity greater than 50 Ohms-cm, which includes, for example, p-doped single crystalline silicon having p-type dopants at an atomic concentration less than $2.0 \times 10^{14}/cm^3$ or n-doped single crystalline silicon having n-type dopants at an atomic concentration less than $1.0 \times 10^{14}/cm^3$. More preferably, the bottom semiconductor layer 10 has a resistivity greater than 1 kOhms-cm, which includes, for example, p-doped single crystalline silicon having p-type dopants at an atomic concentration less than $1.0 \times 10^{13}/cm^3$ or n-doped single crystalline silicon having n-type dopants at an atomic concentration less than $5.0 \times 10^{12}/cm^3$. The conductivity type of the bottom semiconductor layer 10 is herein referred to as a first conductivity type, which may be p-type or n-type.

The high resistivity of the bottom semiconductor layer 10 reduces eddy current, thereby reducing parasitic coupling of radio frequency signal generated or propagated in the top semiconductor layer 30 with the bottom semiconductor layer 10. While silicon is used herein to illustrate the required dopant level for each threshold resistivity value for the bottom semiconductor layer 10, target dopant concentrations for other semiconductor materials may be readily obtained since each type of semiconductor material has a well established relationship between the dopant concentration and the resistivity of the semiconductor material.

The thickness of the bottom semiconductor layer 10 is typically from 400 microns to 1,000 microns, and typically from 500 microns to 900 microns at this step. If the bottom semiconductor layer 10 is subsequently thinned, the thickness of the bottom semiconductor layer 10 may be from 50 microns to 800 microns.

The buried insulator layer 20 comprises a dielectric material such as silicon oxide, silicon nitride, silicon oxynitride, or a combination thereof. The thickness of the buried insulator layer 20 may be from 50 nm to 500 nm, and typically from 100 nm to 300 nm, although lesser and greater thicknesses are also contemplated herein.

The shallow trench isolation structure 33 comprises a dielectric material such as silicon oxide, silicon nitride, silicon oxynitride, or a combination thereof. The shallow trench isolation structure 33 may be formed by forming at least one trench that extends to a top surface of the buried insulator layer 20 within the top semiconductor layer 30, filling the at least one trench with a dielectric material such as silicon oxide, silicon nitride, and/or silicon oxynitride, and removing the portion of the dielectric material from above the top surface of the top semiconductor layer 30 by planarization employing, for example, chemical mechanical planarization (CMP) and/or recess etch. In case the at least one trench is contiguous, the shallow trench isolation structure 33 may be of unitary construction, i.e., in one piece. The shallow trench isolation structure 33 may laterally abut and surround each of the at least one top semiconductor portion 32.

The thickness of the top semiconductor layer 30 may be from 20 nm to 200 nm, and typically from 40 nm to 100 nm, although lesser and greater thicknesses are also contemplated herein. The at least one top semiconductor portion 32 may be implanted with dopants of p-type or n-type. Typically, the dopant concentration of the at least one top semiconductor portion 32 is from $1.0 \times 10^{15}/cm^3$ to $5.0 \times 10^{18}/cm^3$, which corresponds to a dopant concentration for a body region of a field effect transistor, although lesser and greater concentrations are also contemplated herein.

Figure 2:
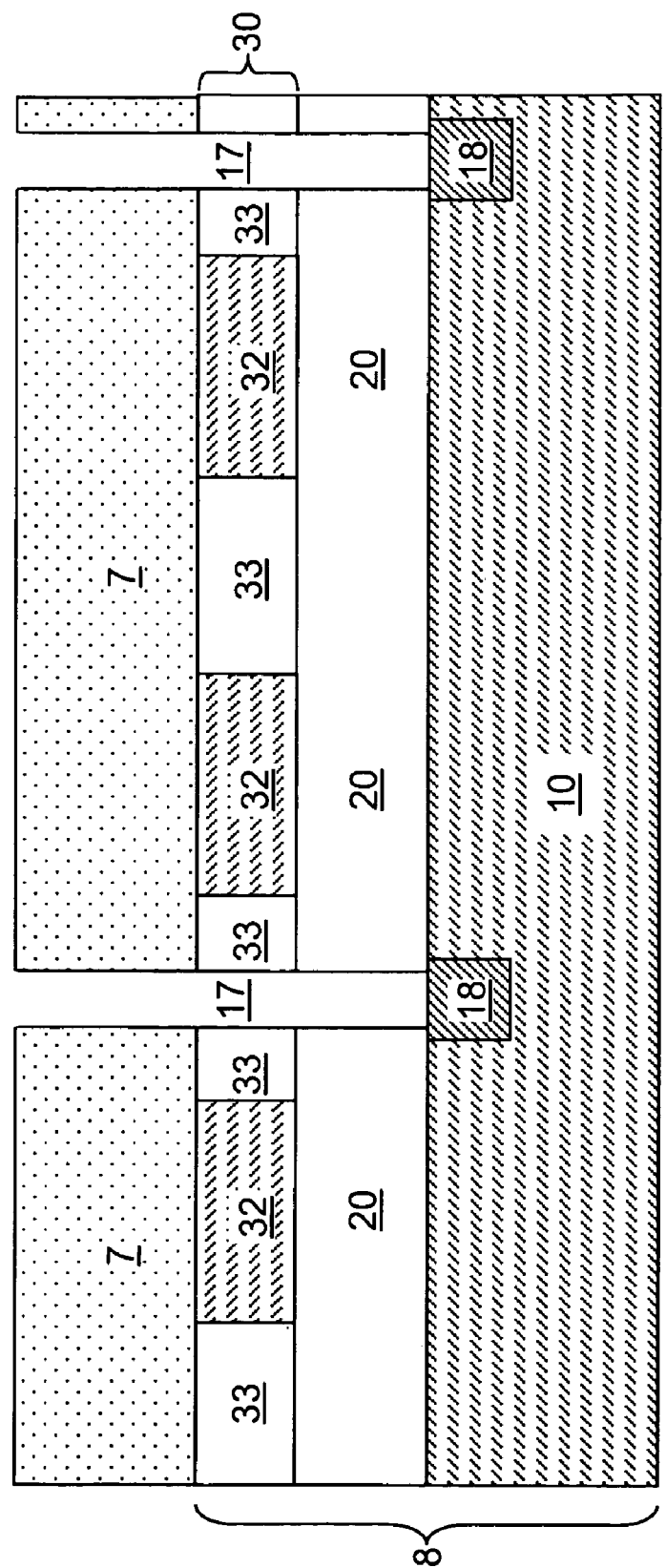

Referring to FIG. 2, a first photoresist 7 is applied to a top surface of the top layer 30 and lithographically patterned to form openings. The openings in the first photoresist 7 overlie the shallow trench isolation structure 33. Each of the openings is located outside the area of the at least one top semiconductor portion 32 and inside the area of the shallow trench isolation structure 33 in a top-down view.

At least one first lower via cavity 17 is formed by transferring the pattern in the first photoresist 7 into the semiconductor substrate 8. The pattern of the openings in the first photoresist 7 is transferred into the shallow trench isolation structure 33 and the buried insulator layer 20 by an anisotropic etch, which may be a reactive ion etch. The first photoresist 7 is employed as an etch mask for the anisotropic etch. The at least one first lower via cavity 17 is formed underneath the openings in the first photoresist 7.

Preferably, the anisotropic etch is selective to the semiconductor material of the semiconductor material of the bottom semiconductor layer 10. For example, if the bottom semiconductor layer 10 comprises silicon, an anisotropic etch that removes dielectric material, such as silicon oxide, selective to silicon may be employed to provide an anisotropic etch that stops on the top surfaces of the top surface of the bottom semiconductor layer 10.

A top surface of the bottom semiconductor layer 10 is exposed at the bottom of each of the at least one first lower via cavity 17. Each of the at least one first lower via cavity 17 is formed within the shallow trench isolation structure 33 and the buried insulator layer 20. Each of the at least one first lower via cavity 17 extends from a top surface of the shallow trench isolation structure 33, through the shallow trench isolation structure 33 and the buried insulator layer 20, and to the top surface of the bottom semiconductor layer 10. Variations in which the at least one first lower via cavity 17 extends further into the bottom semiconductor layer are explicitly contemplated herein.

The sidewalls of each of the at least one first lower via cavity 17 may be substantially vertically coincident from the top surface of the shallow trench isolation structure 33 to the top surface of the bottom semiconductor layer 10. In other words, the portions of the sidewalls of each of the at least one first lower via cavity 17 in the shallow trench isolation structure 33 and the buried insulator layer 20 may overlap each other in a top-down view. In case a taper is present in the sidewalls of the at least one first lower via cavity 17, the angle of taper may be from 0 degree to 5 degrees, and typically from 0 degree to 2 degrees, although greater taper angles are also contemplated herein. The depth of each of the at least one first lower via cavity 17 beneath the top surface of the top semiconductor layer 30 may be equal to the sum of the thickness of the buried insulator layer 20 and the thickness of the top semiconductor layer 30.

The at least one first lower via cavity 17 is an array of lower via cavities. Each lower via cavity in the array of lower via cavities is a discrete via cavity that does not abut another via cavity.

At least one first doped semiconductor region 18 is formed by implanting dopants of the first conductivity type into exposed portion of the bottom semiconductor layer 10. The first conductivity type is the conductivity type of the bottom semiconductor layer 10. The bottom semiconductor layer 10 and the at least one first doped semiconductor region 18 are doped with dopants of the same conductivity type. In one case, the bottom semiconductor layer 10 and the at least one first doped semiconductor region 18 have a p-type doping. In another case, the bottom semiconductor layer 10 and the at least one first doped semiconductor region 18 have an n-type doping.

Due to lateral straggle of the implanted dopants, the at least one first doped semiconductor region 18 extends laterally outside the area of the at least one first lower via cavity 17 and vertically abuts a bottom surface of the buried insulator layer 20. In case the first conductivity type is p-type, the implanted dopants may comprise B, Ga, In, or a combination thereof. In case the first conductivity type is n-type, the implanted dopants may comprise P, As, Sb, or a combination thereof. The first photoresist 7 functions as a self-aligning mask for the ion implantation so the at least one first doped semiconductor region 18 is formed beneath the at least one first lower via cavity 17. Each of the at least one first doped semiconductor region 18 vertically abuts a bottom surface of the at least one first lower via cavity 17 and the bottom surface buried insulator layer 20. In case the bottom semiconductor layer 10 comprises a single crystalline semiconductor material, the at least one first doped semiconductor region 18 is also single crystalline.

The thickness of the at least one first doped semiconductor region 18 may be from 10 nm to 600 nm, and typically from 50 nm to 300 nm, although lesser and greater thicknesses are also contemplated herein. The at least one first doped semiconductor region 18 is typically heavily doped to reduce the resistivity. The at least one first doped semiconductor region 18 may have a dopant concentration from $1.0 \times 10^{19}/cm^3$ to abut $1.0 \times 10^{21}/cm^3$, although lesser and greater dopants concentrations are also contemplated herein. The first photoresist 7 is subsequently removed selective to the top semiconductor layer 30, the exposed sidewalls of the buried insulator layer 20, and the at least one first doped semiconductor region 18.

Figure 3:
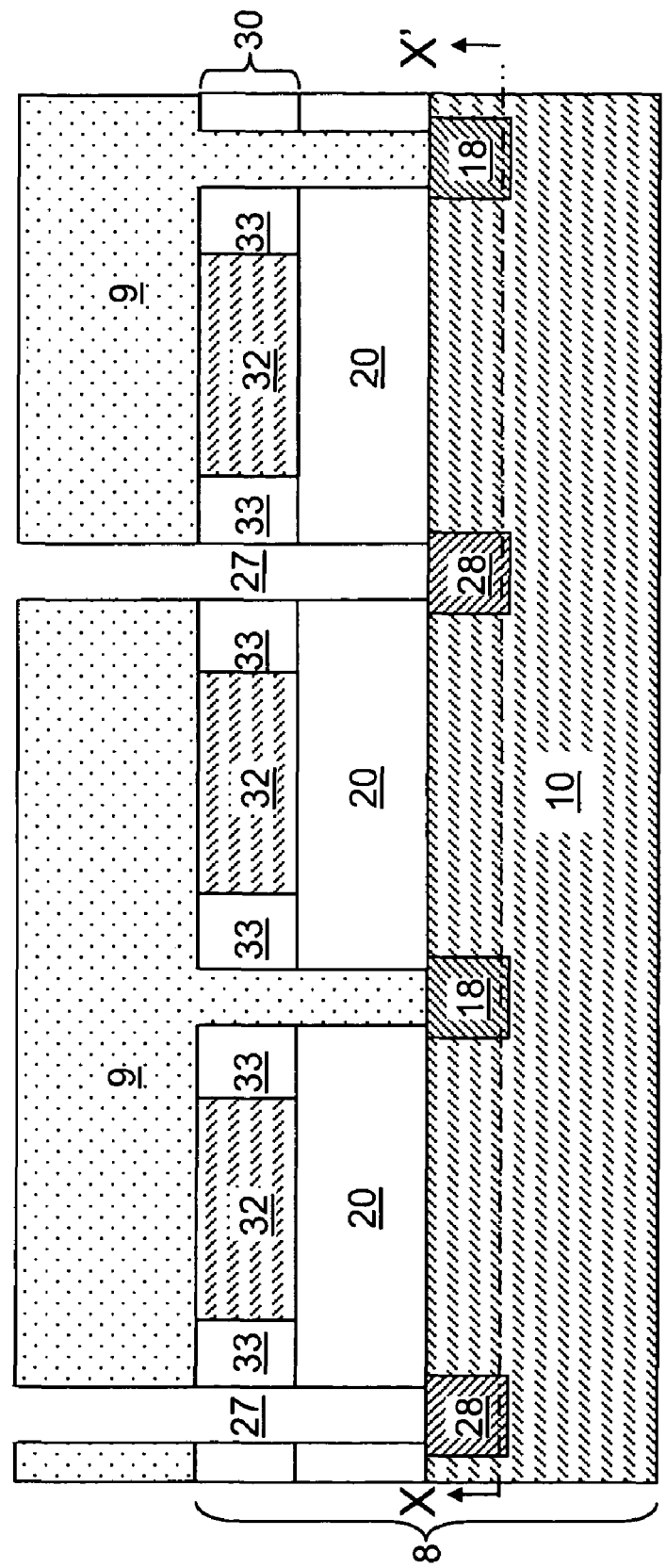
Figure 4:
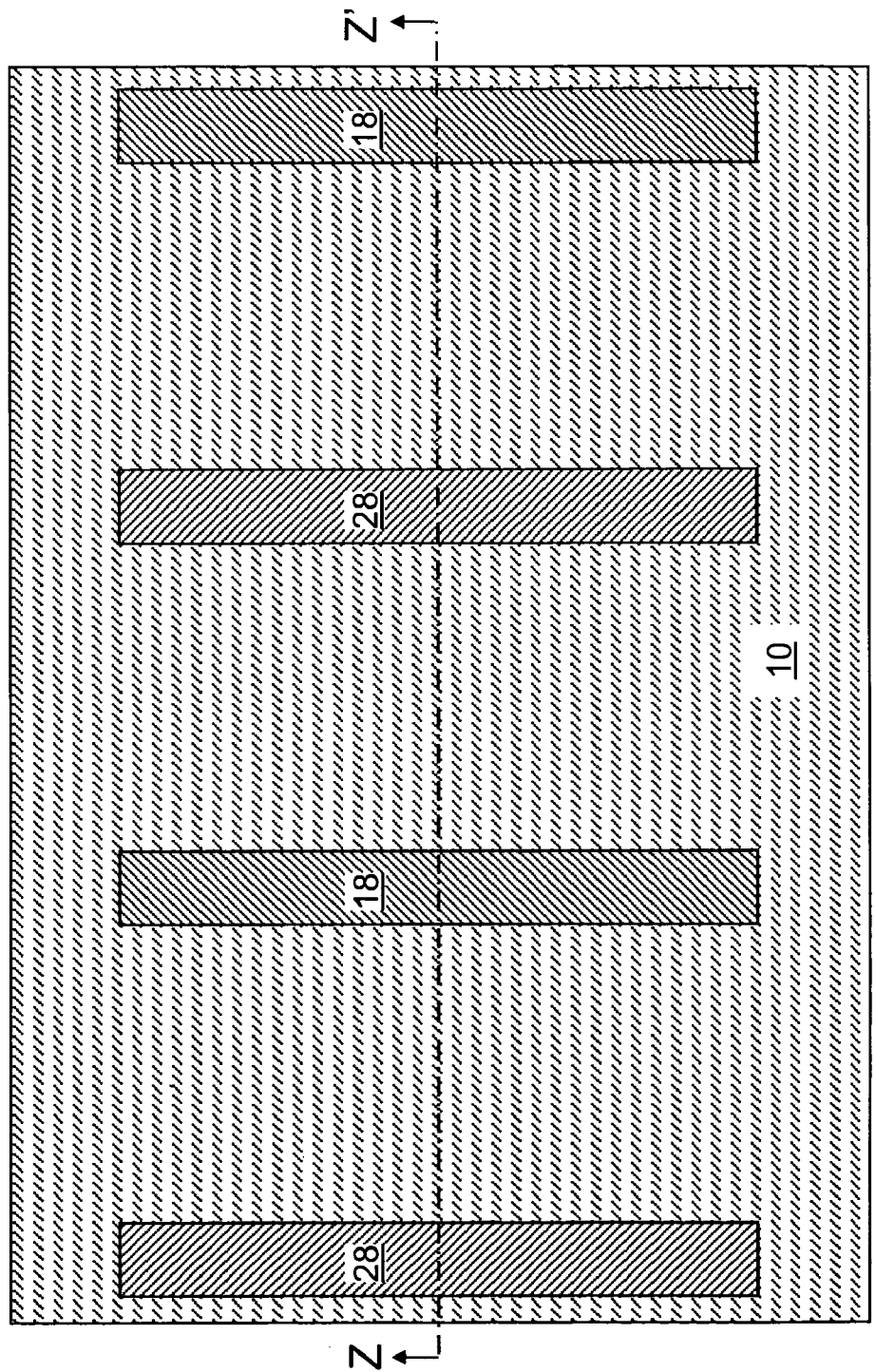

Referring to FIGS. 3 and 4, a second photoresist 9 is applied to the top surface of the top layer 30 and lithographically patterned to form openings. The openings in the second photoresist 9 overlie portions of the shallow trench isolation structure 33 outside the area of the at least one first lower via cavity 17 (See FIG. 3) which may be filled with the second photoresist 9. Each of the openings is located outside the area of the at least one top semiconductor portion 32 and the area of the at least one first lower via cavity 17 and inside the rest of the area of the shallow trench isolation structure 33 in a top-down view.

At least one second lower via cavity 27 is formed by transferring the pattern in the second photoresist 9 into the semiconductor substrate 8. The pattern of the openings in the second photoresist 9 is transferred into the shallow trench isolation structure 33 and the buried insulator layer 20 by an anisotropic etch, which may be a reactive ion etch. The second photoresist 9 is employed as an etch mask for the anisotropic etch. The at least one second lower via cavity 27 is formed underneath the openings in the second photoresist 9.

Preferably, the anisotropic etch is selective to the semiconductor material of the semiconductor material of the bottom semiconductor layer 10. For example, if the bottom semiconductor layer 10 comprises silicon, an anisotropic etch that removes dielectric material, such as silicon oxide, selective to silicon may be employed to provide an anisotropic etch that stops on the top surface of the bottom semiconductor layer 10.

A top surface of the bottom semiconductor layer 10 is exposed at the bottom of each of the at least one second lower via cavity 27. Each of the at least one second lower via cavity 27 is formed within the shallow trench isolation structure 33 and the buried insulator layer 20. Each of the at least one second lower via cavity 27 extends from a top surface of the shallow trench isolation structure 33, through the shallow trench isolation structure 33 and the buried insulator layer 20, and to the top surface of the bottom semiconductor layer 10. Variations in which the at least one second lower via cavity 27 extends further into the bottom semiconductor layer are explicitly contemplated herein.

The sidewalls of each of the at least one second lower via cavity 27 may be substantially vertically coincident from the top surface of the shallow trench isolation structure 33 or may have a taper as the sidewalls of the at least one first lower via cavity 17 as described above.

The at least one second lower via cavity 27 is an array of lower via cavities. Each lower via cavity in the array of lower via cavities is a discrete via cavity that does not abut another via cavity.

At least one second doped semiconductor region 28 is formed by implanting dopants of a second conductivity type into exposed portion of the bottom semiconductor layer 10. The second conductivity type is the opposite of the first conductivity type. If the first conductivity type is p-type, the second conductivity type is n-type, and vice versa. Due to lateral straggle of the implanted dopants, the at least one second doped semiconductor region extends laterally outside the area of the at least one second lower via cavity 27 and vertically abuts a bottom surface of the buried insulator layer 20. In case the first conductivity type is p-type, the implanted dopants may comprise B, Ga, In, or a combination thereof. In case the first conductivity type is n-type, the implanted dopants may comprise P, As, Sb, or a combination thereof. The second photoresist 9 functions as a self-aligning mask for the ion implantation so the at least one second doped semiconductor region 28 is formed beneath the at least one second lower via cavity 27. Each of the at least one doped semiconductor region vertically abuts a bottom surface of the at least one lower via cavity and the bottom surface buried insulator layer 20. In case the bottom semiconductor layer 10 comprises a single crystalline semiconductor material, the at least one second doped semiconductor region 28 is also single crystalline.

The thickness of the at least one second doped semiconductor region 28 may be from 10 nm to 600 nm, and typically from 50 nm to 300 nm, although lesser and greater thicknesses are also contemplated herein. The at least one second doped semiconductor region 28 is typically heavily doped to reduce the resistivity. The at least one second doped semiconductor region 28 may have a dopant concentration from $1.0 \times 10^{19}/cm^3$ to abut $1.0 \times 10^{21}/cm^3$, although lesser and greater dopants concentrations are also contemplated herein. The second photoresist 9 is subsequently removed selective to the top semiconductor layer 30, the exposed sidewalls of the buried insulator layer 20, and the at least one second doped semiconductor region 28. The at least one second doped semiconductor region 28 does not laterally abut the at least one first doped semiconductor region 18.

Figure 5:
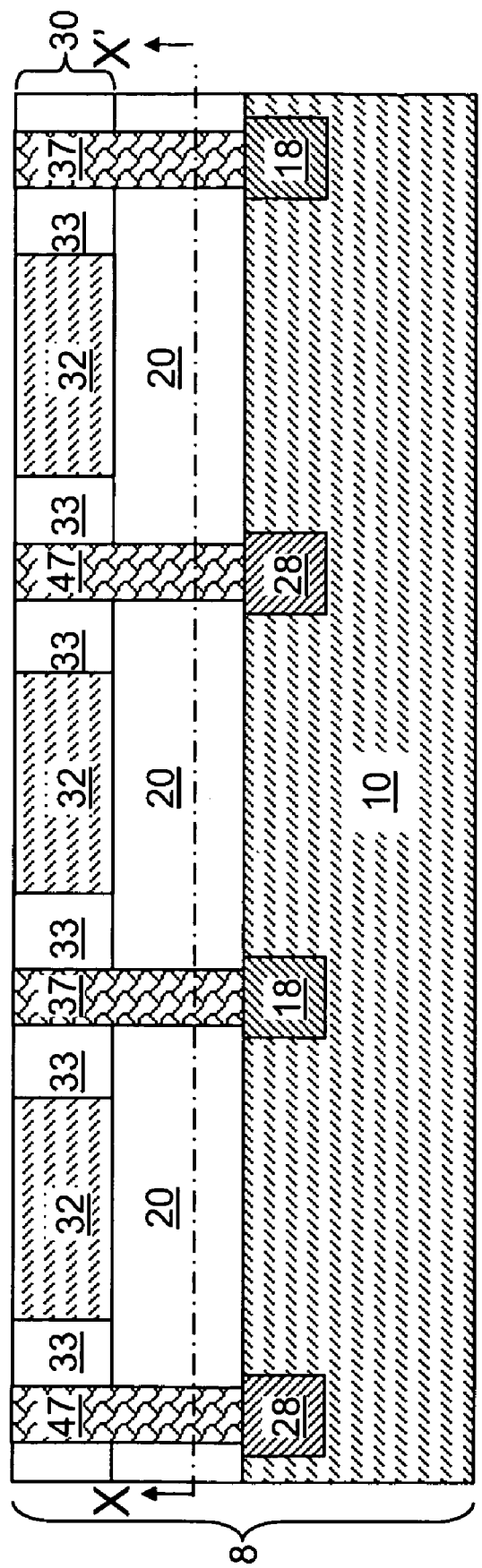
Figure 6:
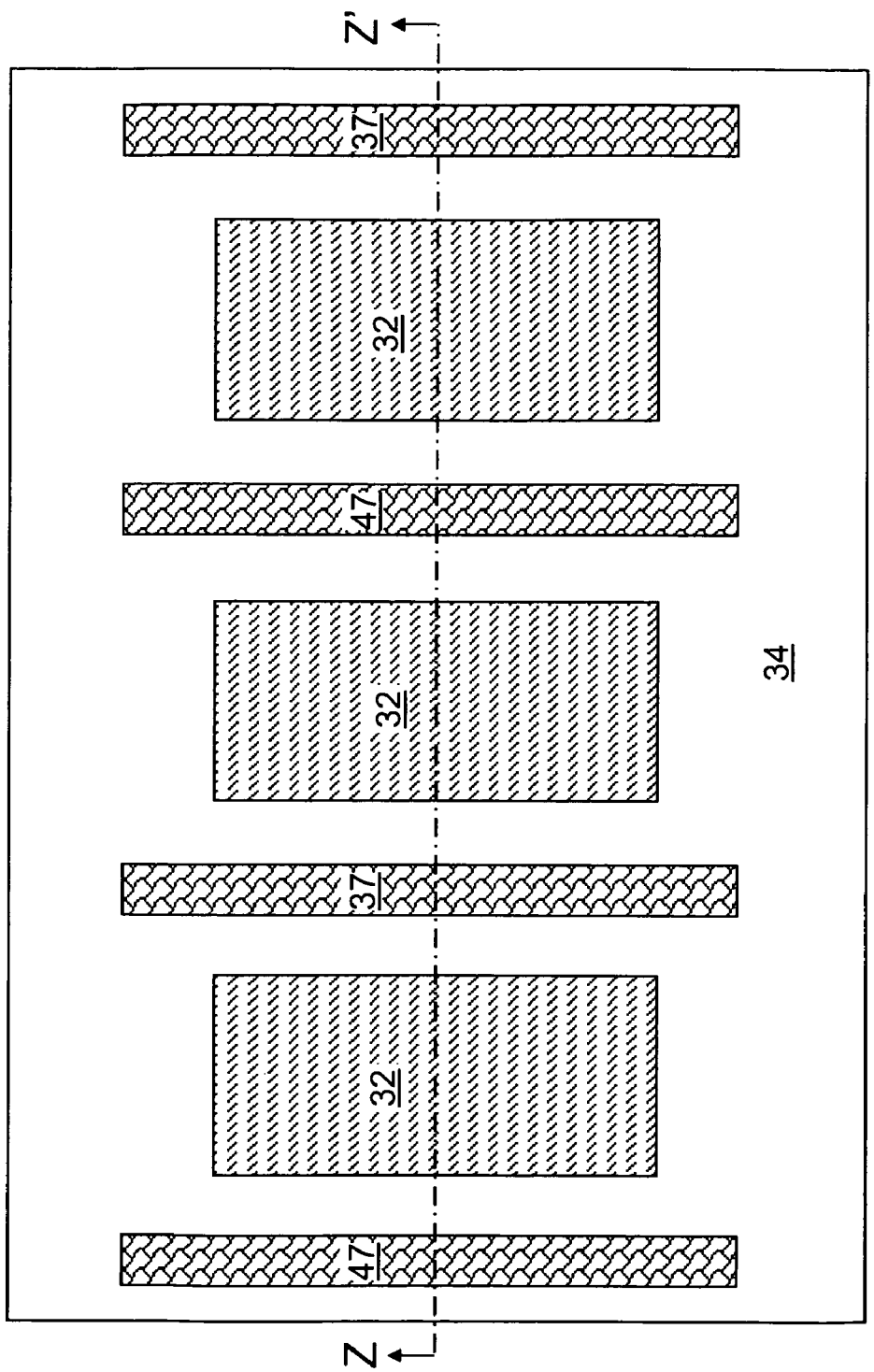

Referring to FIGS. 5 and 6, at least one first lower conductive via 37 and at least one second lower conductive via 47 are formed. The at least one first lower conductive via 37 is formed within each of the at least one first lower via cavity 17 in the shallow trench isolation structure 33 and the buried insulator layer 20. Likewise, the at least one second lower conductive via 47 is formed within each of the at least one second lower via cavity 27 in the shallow trench isolation structure 33 and the buried insulator layer 20.

Specifically, a conductive material is deposited into the at least one first lower via cavity 17 and the at least one second lower via cavity 27. The conductive material may be a doped semiconductor material or a metallic material. For example, the conductive material may be doped polysilicon, a doped silicon-containing semiconductor material, a doped compound semiconductor material, an elemental metal, an alloy of at least two elemental metals, a conductive metal nitride, etc. The excess conductive material above the top surface of the top semiconductor layer 30 is removed, for example, by chemical mechanical planarization (CMP), recess etch, or a combination thereof. The remaining portions of the conductive material in the at least one first lower via cavity 17 and the at least one second lower via cavity 27 constitute the at least one first lower conductive via 37 and the at least one second lower conductive via 47, respectively. In case at least one pad dielectric layer (not shown) is employed over the top semiconductor layer, the at least one dielectric layer may be advantageously employed for planarization of the conductive material to facilitate the formation of the at least one first lower conductive via 37 and the at least one second lower conductive via 47. The at least one pad dielectric layer, if employed, is subsequently removed to expose the top surface of the top semiconductor layer 30.

Each of the at least one first lower conductive via 37 extends from a top surface of the shallow trench isolation structure 33 to the top surface of the at least one first doped semiconductor region 18. Each of the at least one second lower conductive via 47 extends from a top surface of the shallow trench isolation structure 33 to the top surface of the at least one second doped semiconductor region 28. Each of the at least one first lower conductive via 37 vertically abuts the top surface of the at least one first doped semiconductor region 18. Each of the at least one second lower conductive via 47 vertically abuts the top surface of the at least one first doped semiconductor region 28.

Figure 7:
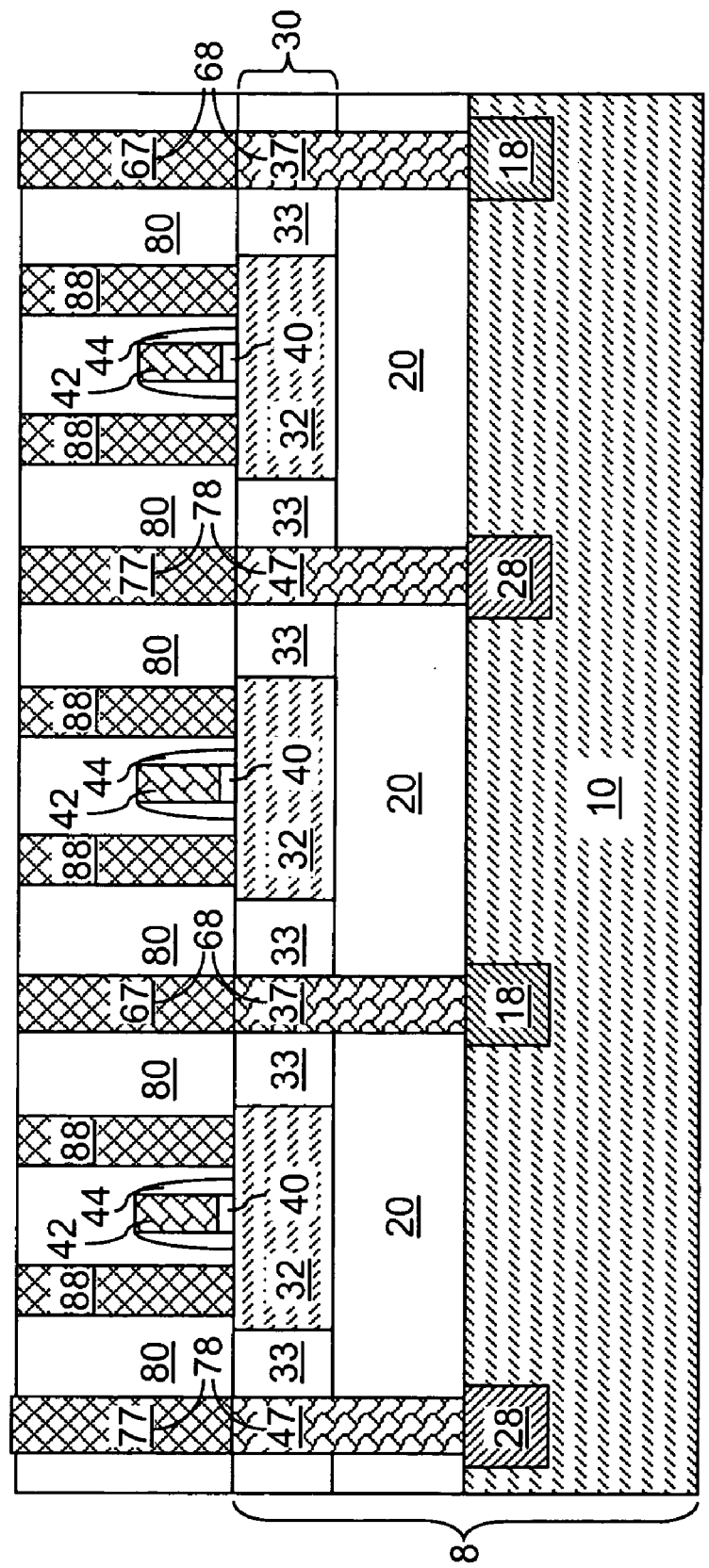
Figure 8:
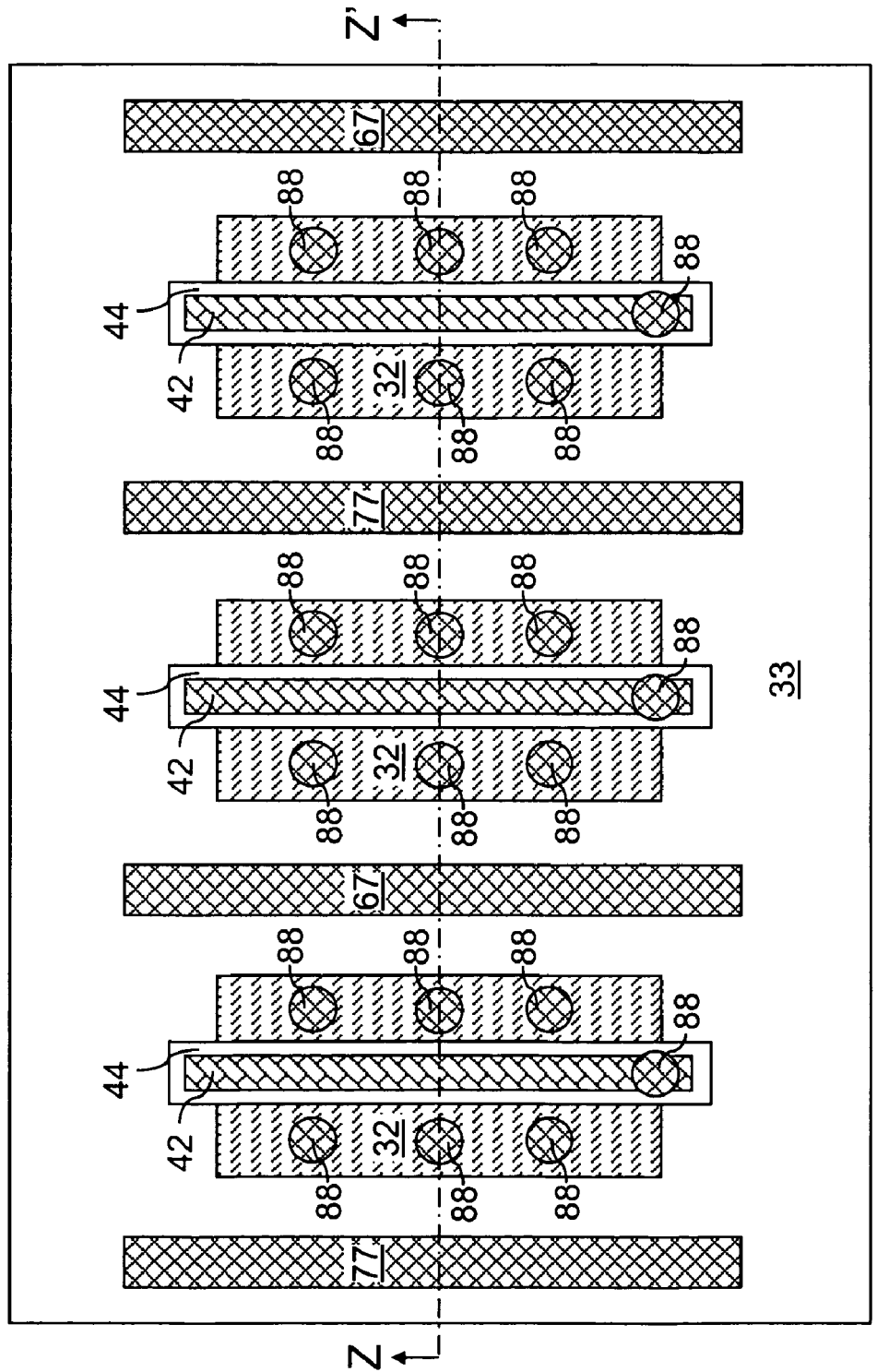

Referring to FIGS. 7 and 8, at least one field effect transistor is formed directly on the at least one top semiconductor portion 32 by methods known in the art. Specifically, at least one gate dielectric 40, at least one gate electrode 42, and at least one gate spacer 44 are formed for each field effect transistor. A source region (not shown) and a drain region (not shown) are also formed in the at least one top semiconductor portion 32 for each field effect transistor by implanting dopants employing the gate electrode 42 and the gate spacer 44 of the field effect transistor as a self-aligning implantation mask.

A middle-of-line (MOL) dielectric layer 80 is formed on the at least one field effect transistor, the at least one top semiconductor portion 32, the shallow trench isolation structure 33, the top surfaces of the at least one first lower conductive via 37, and at least one second lower conductive via 47. The MOL dielectric layer 80 may comprise silicon oxide, silicon nitride, silicon oxynitride, an organosilicate glass (OSG), low-k chemical vapor deposition (CVD) oxide, a self-planarizing material such as a spin-on glass (SOG), and/or a spin-on low-k dielectric material such as SiLK™. Exemplary silicon oxides include undoped silicate glass (USG), borosilicate glass (BSG), phosphosilicate glass (PSG), fluorosilicate glass (FSG), borophosphosilicate glass (BPSG), or a combination thereof. The total thickness of the MOL dielectric layer 80, as measured from a top surface of the shallow trench isolation structure 33, may be from 100 nm to 10,000 nm, and typically from 200 nm to 5,000 nm. The top surface of the MOL dielectric layer 80 may be planarized, for example, by chemical mechanical planarization.

Openings are formed in the MOL dielectric layer 80 by lithographic methods and an anisotropic etch to expose top surfaces of the at least one first lower conductive via 37, at least one second lower conductive via 47, and portions of the at least one field effect transistor such as at least one source region (not shown), at least one drain region (not shown), and at least one gate electrode 42. At least one first upper conductive via 67 is formed directly on the at least one first lower conductive via 37. At least one second upper conductive via 77 is formed directly on the at least one second lower conductive via 47. Device contact vias 88 are formed directly on the at least one field effect transistor.

The at least one first upper conductive via 67, the at least one second upper conductive via 77, and the device contact vias 88 comprise a conductive material. The conductive material may be a doped semiconductor material or a metallic material. For example, the conductive material may be doped polysilicon, a doped silicon-containing semiconductor material, a doped compound semiconductor material, an elemental metal, an alloy of at least two elemental metals, a conductive metal nitride, etc. The excess conductive material above the top surface of the MOL dielectric layer 80 is removed, for example, by chemical mechanical planarization (CMP), recess etch, or a combination thereof.

Each vertically abutting pair of a first lower conductive via 37 and a first upper conductive via 67 collectively constitutes a first conductive via 68. Each vertically abutting pair of a second lower conductive via 47 and a second upper conductive via 77 collectively constitutes a second conductive via 78. The material of the first and second upper conductive vias (67, 77) may be the same as, or different from, the material of the first and second lower conductive vias (37, 47).

Figure 9:
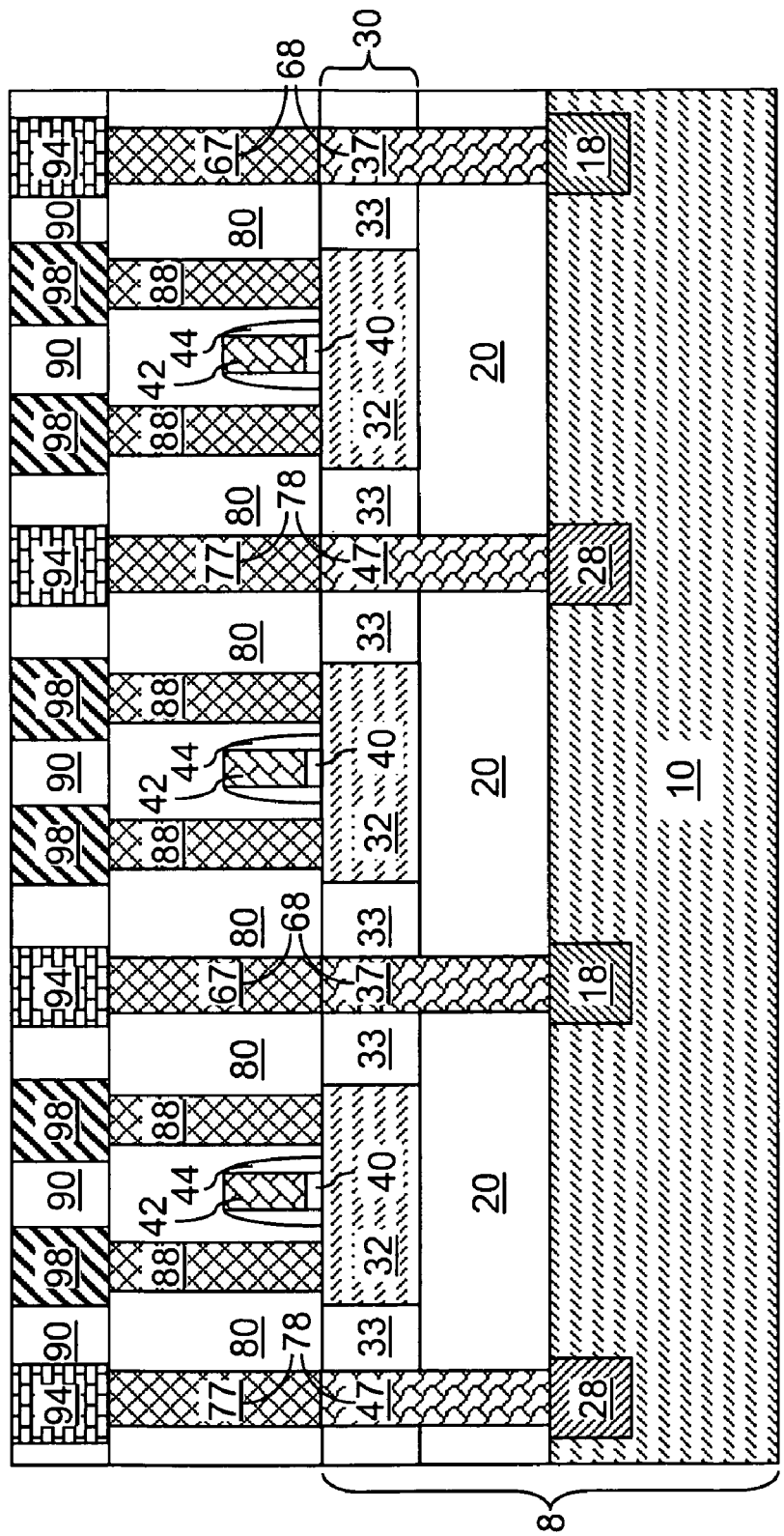
Figure 10:
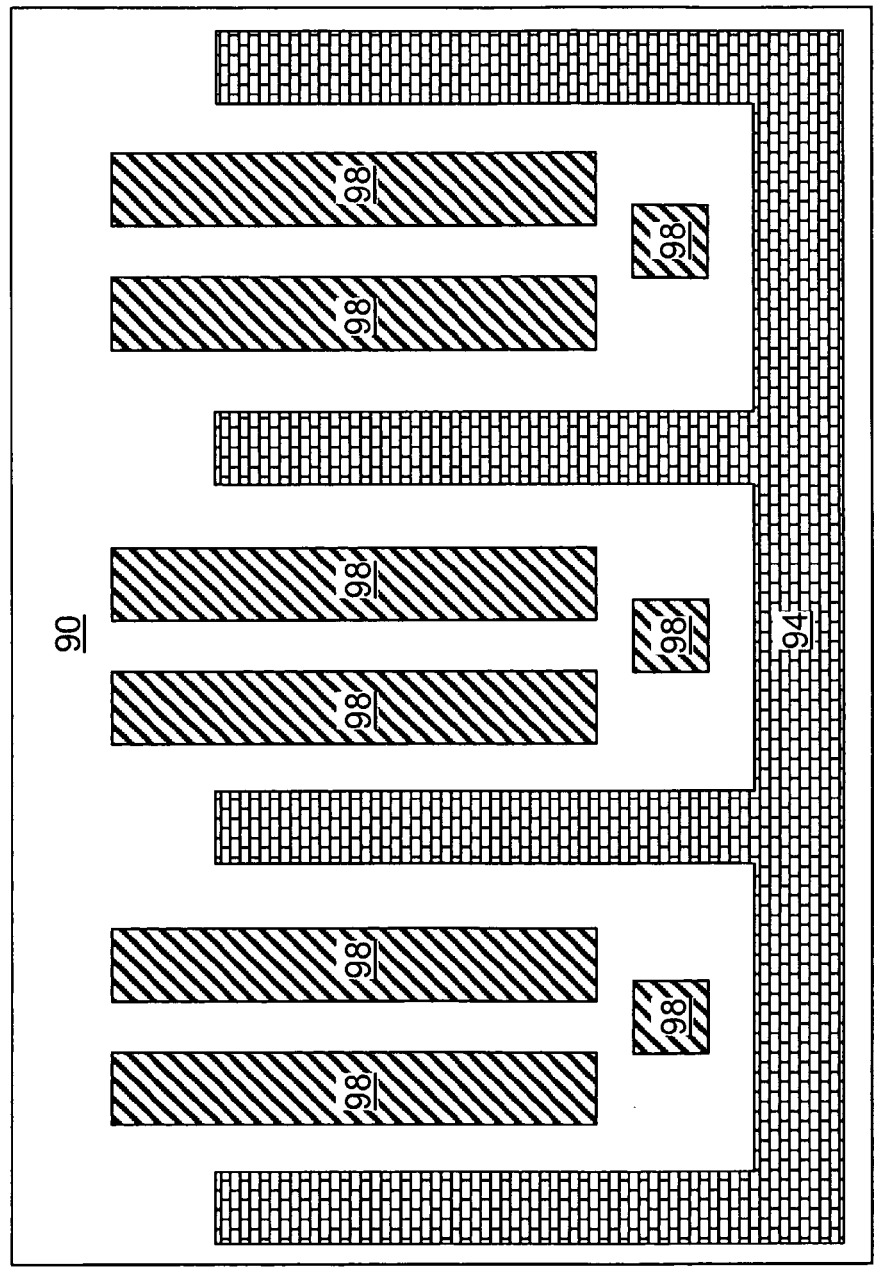

Referring to FIGS. 9 and 10, an interconnect-level dielectric layer 90, first interconnect-level metal lines 98, and a second interconnect-level metal line 94 are formed directly on the top surface of the MOL dielectric layer 80. The dielectric material for the interconnect-level dielectric layer 90 may comprise any of the dielectric materials that may be employed for the MOL dielectric layer 80 as described above. The thickness of the interconnect-level dielectric layer 90 may be from 75 nm to 1,000 nm, and typically from 150 nm to 500 nm, although lesser and greater thicknesses are also contemplated herein.

The first interconnect-level metal lines 98 and the second interconnect-level metal line 94 are embedded in the interconnect-level dielectric layer 90, and may be formed by deposition of a metallic material and a subsequent planarization. The metallic material of the first interconnect-level metal lines 98 and the second interconnect-level metal line 94 may be deposited by physical vapor deposition (PVD), electroplating, electroless plating, chemical vapor deposition, or a combination thereof. The first interconnect-level metal lines 98 and the second interconnect-level metal line 94 may comprise, for example, Cu, Al, W, Ta, Ti, WN, TaN, TiN, or a combination thereof. The first interconnect-level metal lines 98 and the second interconnect-level metal line 94 may comprise the same metallic material.

Each of the first interconnect-level metal lines 98 vertically abuts the device contact vias 88. The second interconnect-level metal line 94 vertically abuts the at least one first upper conductive via 67, the at least one second upper conductive via 77.

Each of the at least one first conductive via 68 and the at least one second conductive via 78 extends from the top surface of the MOL dielectric layer 80 to the top surface of the at least one first doped semiconductor region 18 or the at least one second doped semiconductor region 28. A physically manifested interface is present between each vertically abutting pair of a first lower conductive via 37 and a first upper conductive via 67 and between each vertically abutting pair of a second lower conductive via 47 and a second upper conductive via 77. The first exemplary semiconductor structure includes the at least one field effect transistor, which may constitute a radio frequency switch for a signal having a frequency from 3 Hz to 300 GHz. Particularly, the at least one field effect transistor may constitute a radio frequency switch that is capable of operating at VHF, UHF, SHF, and EHF.

At such high frequencies, capacitive coupling between the at least one field effect transistor and the bottom semiconductor layer 10 may become significant since the capacitive coupling increases linearly with frequency. The radio frequency signal in the at least one field effect transistor causes formation of an induced charge layer in an upper portion of the bottom semiconductor layer 10. In the absence of electrical bias applied to the bottom semiconductor layer 10, the induced charge layer is formed directly underneath the buried insulator layer 20, and includes positive charges or negative charges.

In the present invention, the at least one first doped semiconductor region 18 and the at least one second doped semiconductor region 28 are electrically biased through the second interconnect-level metal line 94, the at least one first conductive via 68, and the at least one second conductive via 78. The at least one first doped semiconductor region 18 and the at least one second doped semiconductor region 28 are electrically biased at the same voltage.

In one embodiment, the electrical voltage at the at least one first doped semiconductor region 18 and the at least one second doped semiconductor region 28 may the same as the voltage applied to the bottom semiconductor layer 10 so that the at least one first doped semiconductor region 18, the at least one second doped semiconductor region 28, and the bottom semiconductor layer 10 are electrically grounded.

In another embodiment, the p-n junction between the bottom semiconductor layer 10 and the at least one second doped semiconductor region 28 may be forward biased with a voltage difference that does not induce avalanche current. Specifically, the voltage difference does not exceed 0.6 V. In case the first conductivity type is p-type and the second conductivity type is n-type, the voltage at the at least one second doped semiconductor region 28 may be from 0 V to −0.6 V relative to the voltage applied to the bottom semiconductor layer 10. In case the first conductivity type is n-type and the second conductivity type is p-type, the voltage at the at least one second doped semiconductor region 28 may be from 0 V to +0.6 V relative to the voltage applied to the bottom semiconductor layer 10.

By applying voltage bias to the at least one first doped semiconductor region 18 and the at least one second doped semiconductor region 28, electrical charges induced in an induced charge layer in an upper portion of the bottom semiconductor layer 10 are extracted through the at least one first conductive via 68 and the at least one second conductive via 78. Specifically, during the portion of each cycle of a radio frequency (RF) signal applied to the at least one field effect transistor that induces majority charge carriers in an accumulation mode in the induced charge layer, the majority charge carriers are removed through the at least one first doped semiconductor region 18 and the at least one first conductive via 68. During the portion of each cycle of the RF signal that induces minority charge carriers in an inversion mode in the induced charge layer, the minority charge carriers are removed through the at lease one second doped semiconductor region 28 and the at least one second conductive via 78. Thus, electrical charges in the induced charge layer are continually drained through the at least one first conductive via 68 and the at least one second conductive via 78 to prevent presence of a large amount of charge in the induced charge layer. The reduction in the electrical charges in the induced charge layer reduced capacitive coupling between the RF signal in the at least one field effect transistor and the bottom semiconductor layer 10 so that harmonic generation in the RF signal is reduced. This increases signal fidelity of the RF signal as it propagates through the at least one field effect transistor, which may function as an RF switch.

Figure 11:
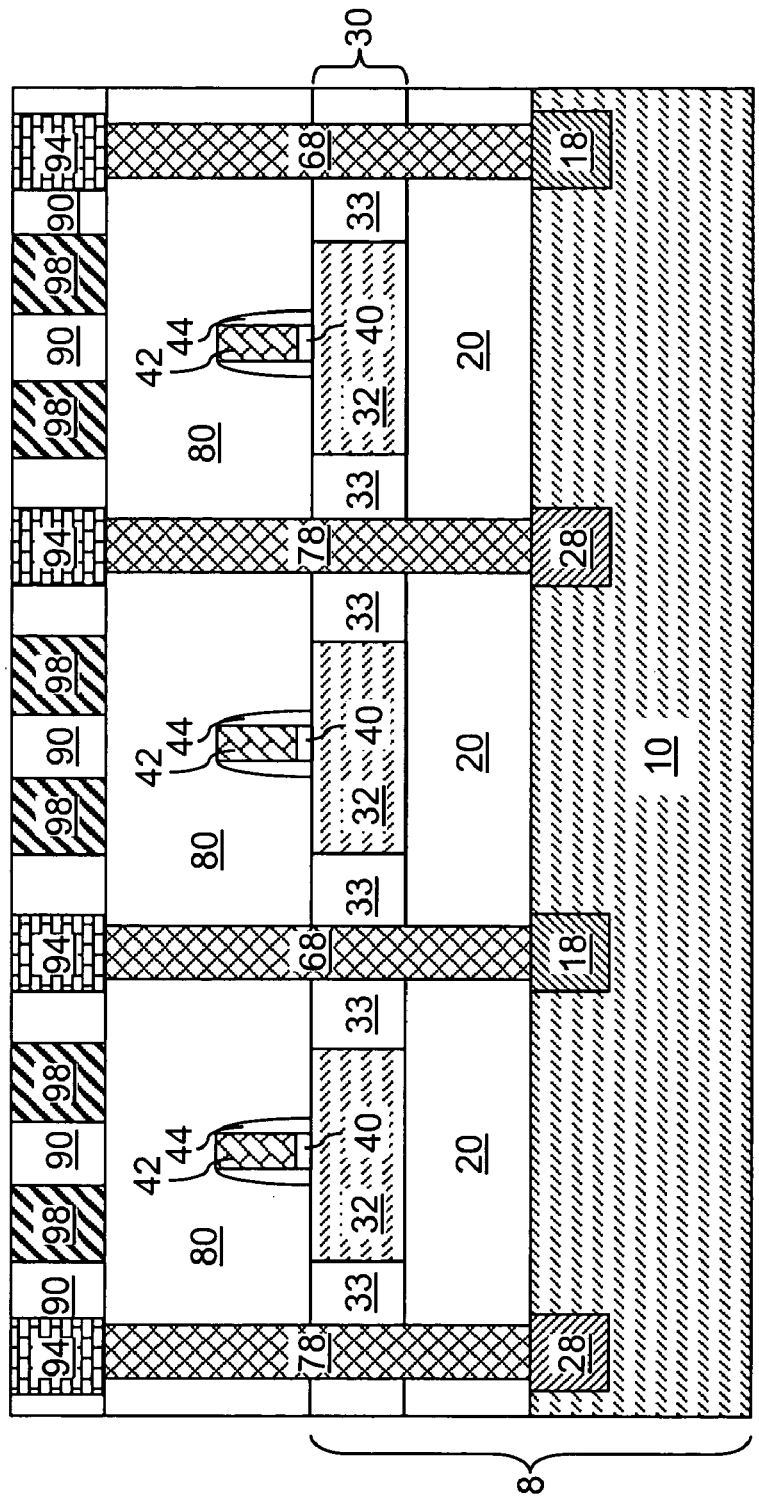
FIG. 11 is a vertical cross-sectional view of a second exemplary semiconductor structure according to a second embodiment of the present invention.

Referring to FIG. 11, a second exemplary semiconductor structure according to a second embodiment of the present invention is derived from the first exemplary semiconductor structure by modifying the methods employed to form the at least one first conductive via 68 and the at least one second conductive via 78. In the second embodiment, the at least one first doped semiconductor region 18 and the at least one second doped semiconductor region 28 are sequentially formed by employing masking layers and implanting dopants of the first conductivity type and the second conductivity type, respectively, through openings in the masking layers. The masking layers may be photoresist layers. Two masking layers and two separate ion implantation steps are employed to form the at least one first doped semiconductor region 18 and the at least one second doped semiconductor region 28. The dopant ions of the first and second conductivity types are implanted through the shallow trench isolation structures 22 and the buried insulator layer 20. The at least one second doped semiconductor region 28 does not laterally abut the at least one first doped semiconductor region 18.

Formation of the at least one first conductive via 68 and the at least one second conductive via 78 may be effected by forming via cavities extending from a top surface of the MOL dielectric layer 80 to the top surfaces of the at least one first doped semiconductor region 18 and the at least one second doped semiconductor region 28. The at least one first conductive via 68 is formed directly on the at least one first doped semiconductor region 18, and the at least one second conductive via 78 is formed directly on the at least one second doped semiconductor region 28. Each of the at least one first conductive via 68 is of unitary construction and extends from the top surface of said MOL dielectric layer 80 to the top surface of the at least one first doped semiconductor region 18. Each of the at least one second conductive via 78 is of unitary construction and extends from the top surface of said MOL dielectric layer 80 to the top surface of the at least one second doped semiconductor region 28. The second exemplary semiconductor structure operates in the same manner as the first exemplary semiconductor structure.

Figure 12:
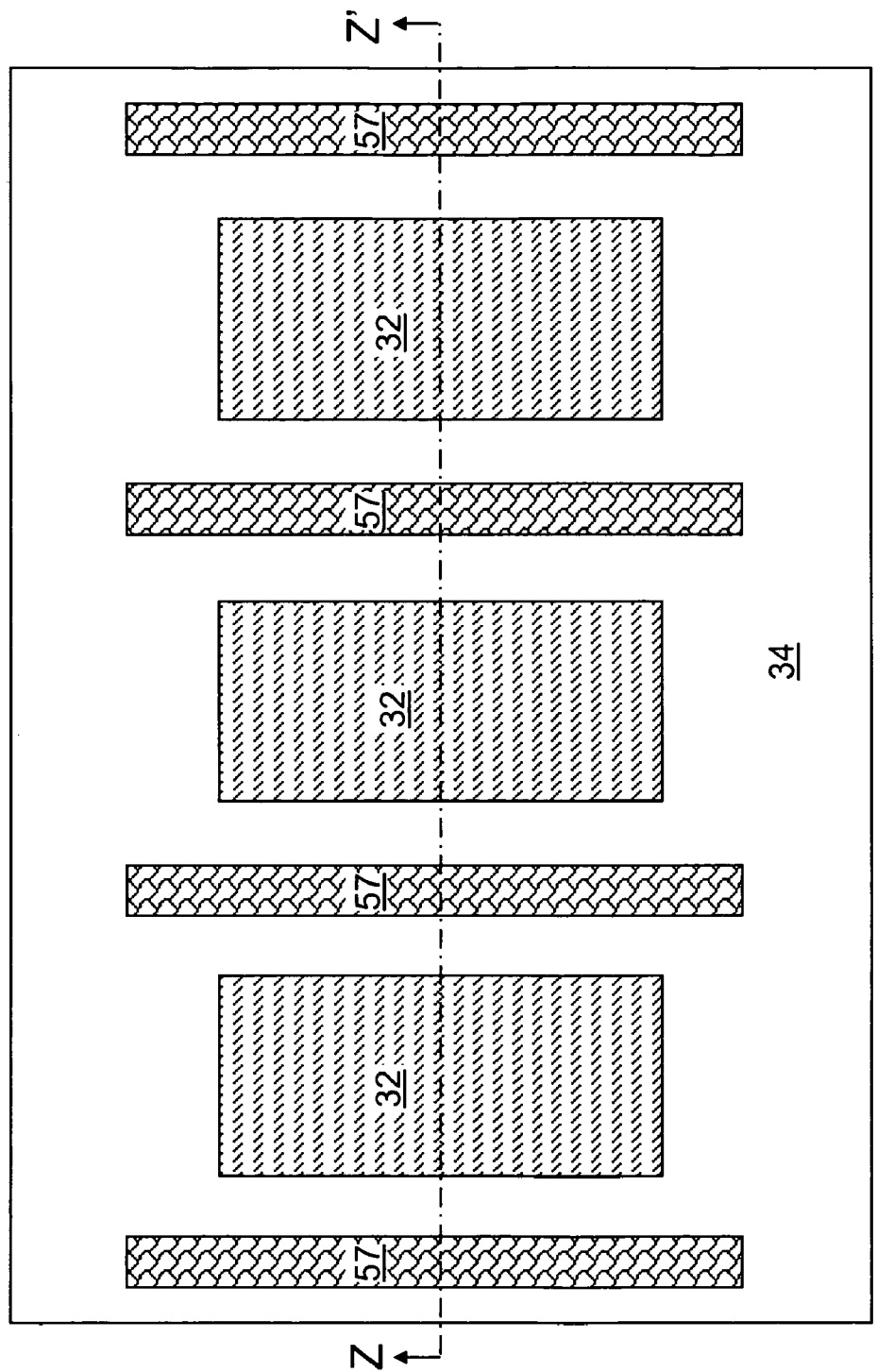
FIGS. 12-14 are various views of a third exemplary semiconductor structure according to a third embodiment of the present invention.
Figure 13:
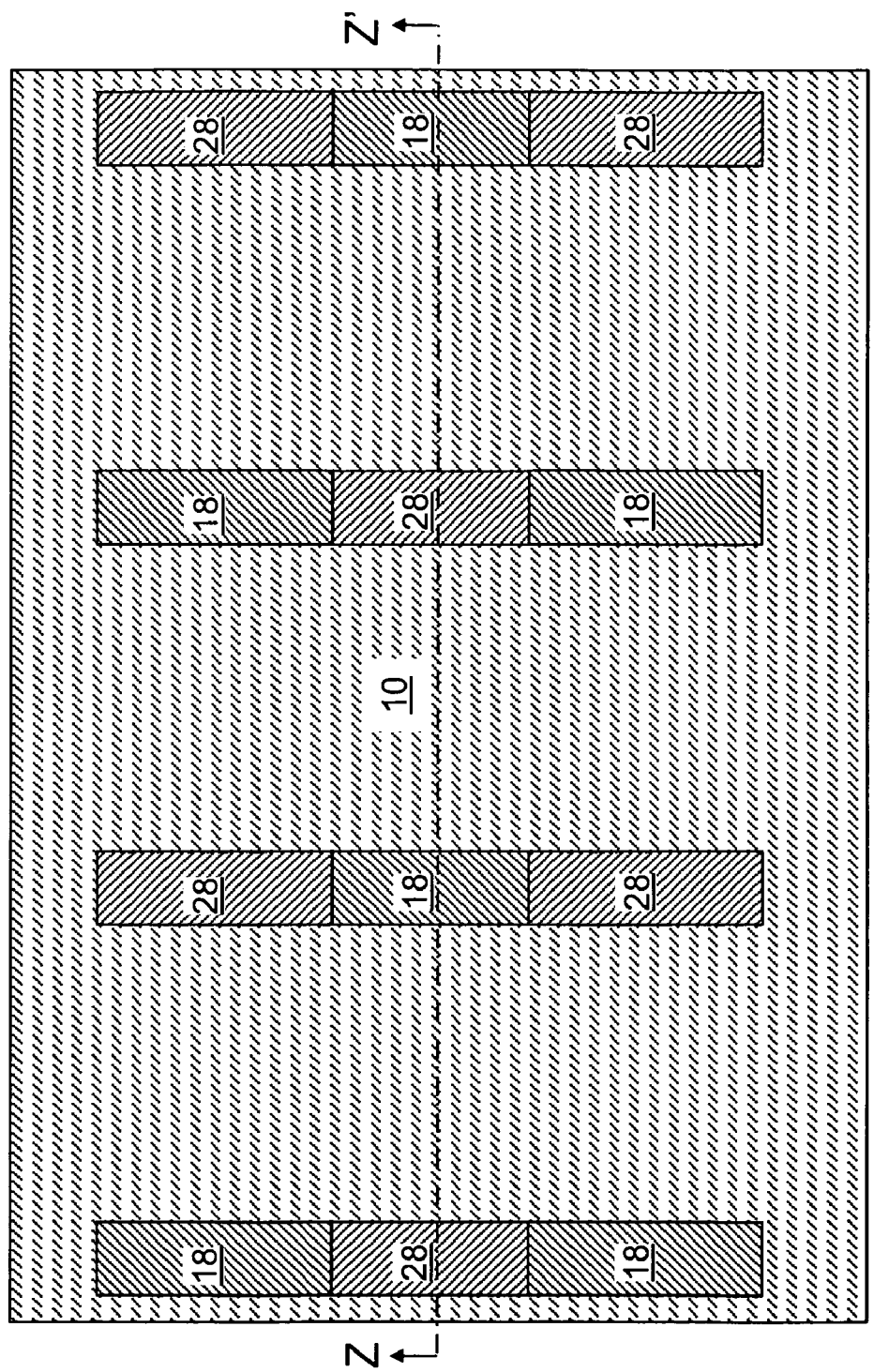
Figure 14:
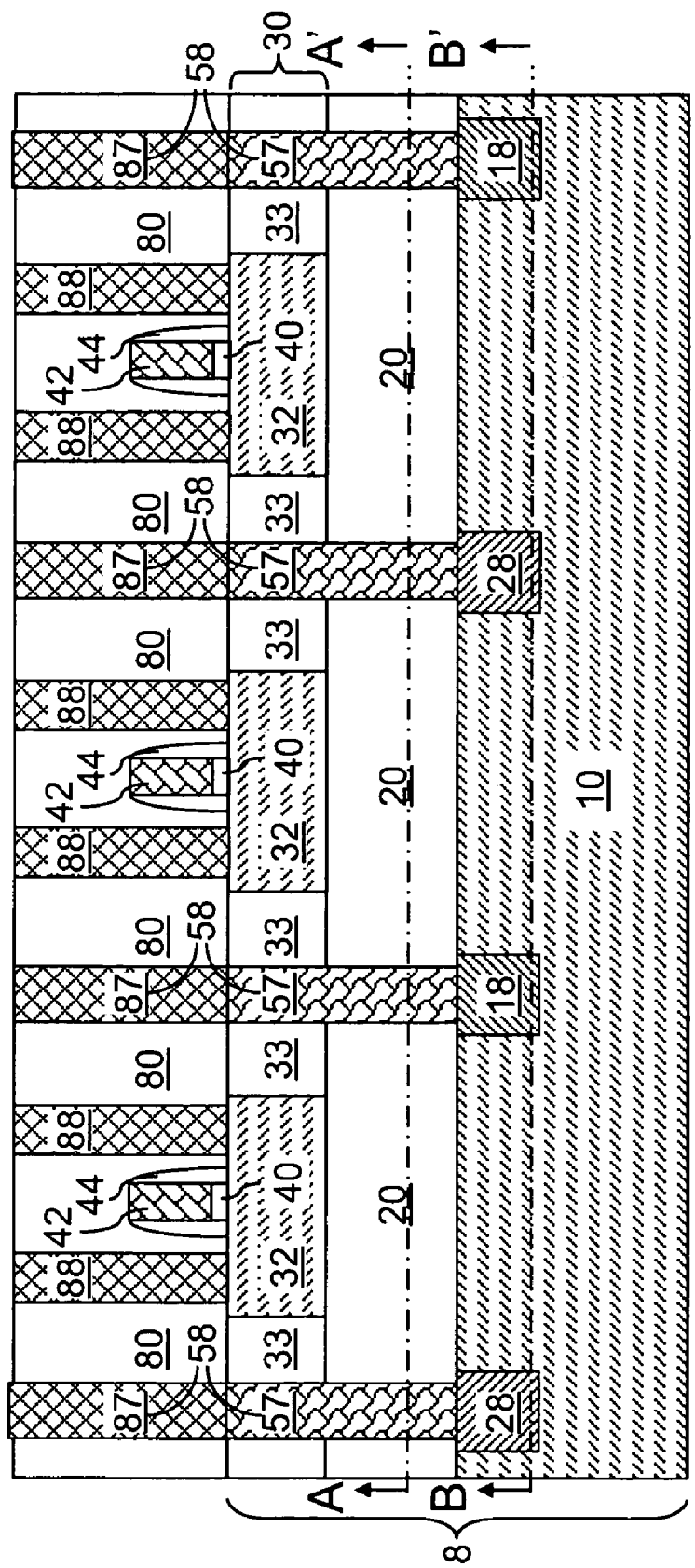

Referring to FIGS. 12, 13, and 14, a third exemplary semiconductor structure according to a third embodiment of the present invention may be formed by forming the at least one first lower via cavity 17 and the at least one second lower via cavity 27 (See FIGS. 2 and 3) at locations that are adjacent to each other. In this case, each of the at least one first doped semiconductor region 18 laterally abuts one or more of the at least one second doped semiconductor region 28. At least one lower conductive via 57 is formed directly on the at least one first doped semiconductor region 18 and the at least one second doped semiconductor region 28. Each of the at least one lower conductive via 57 vertically abuts one or more of the at least one first doped semiconductor region 18 and one or more of the at least one second doped semiconductor region 28. The at least one lower conductive via 57 of the third embodiment replaces the at least one first lower conductive via 37 and the at least one second lower conductive via 47 of the first embodiment. Likewise, at least one upper conductive via 87 of the third embodiment replaces the at least one first upper conductive via 67 and the at least one second upper conductive via 77 of the first embodiment. A vertically abutting pair of a lower conductive via 57 and an upper conductive via collectively constitutes a conductive via 58. The third exemplary semiconductor structure operates in the same manner as the first exemplary semiconductor structure.

Figure 15:
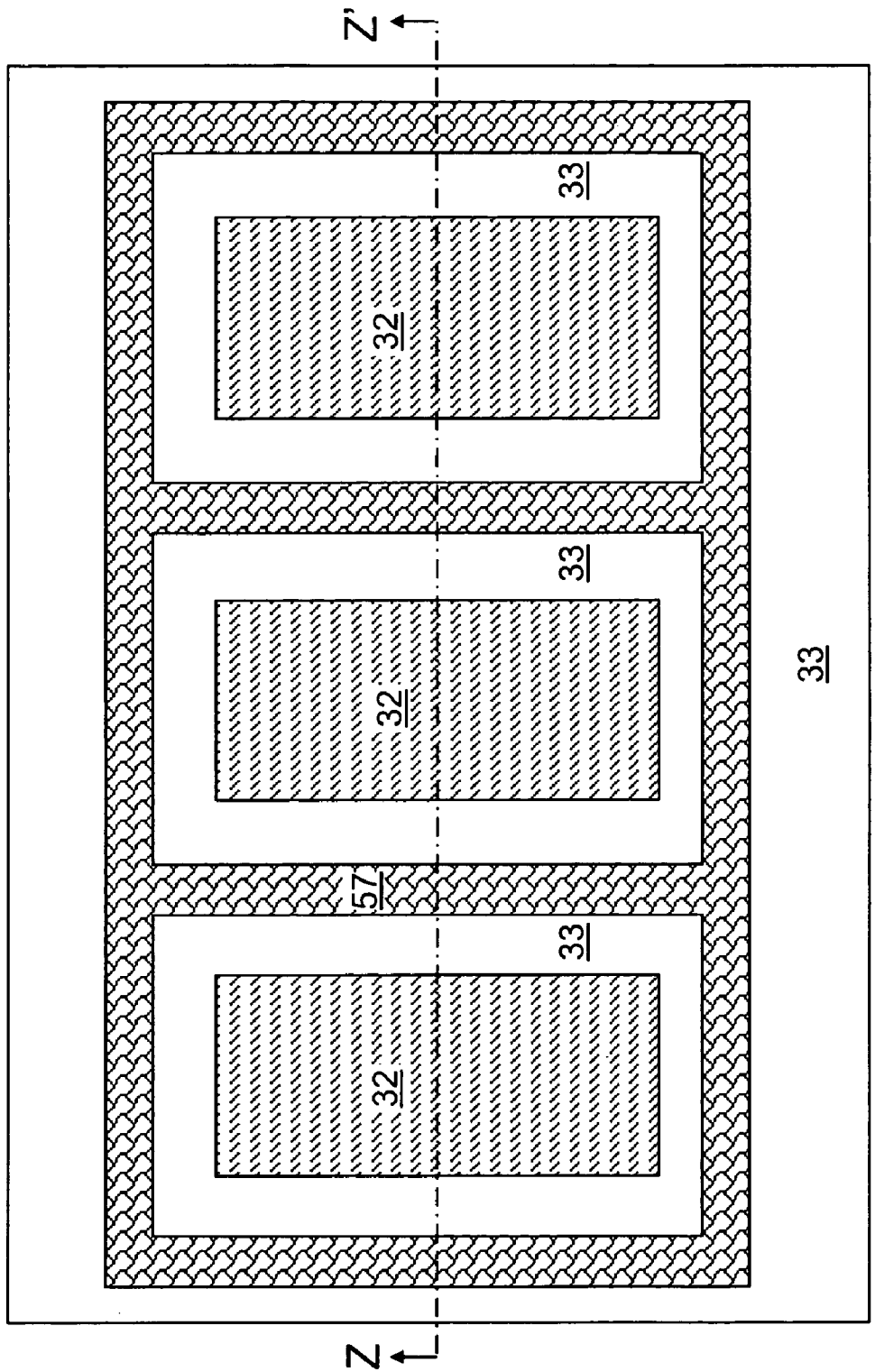
FIGS. 15 and 16 are various views of a fourth exemplary semiconductor structure according to a fourth embodiment of the present invention. The vertical cross-sectional view of the fourth exemplary semiconductor structure is the same as FIG. 14.
Figure 16:
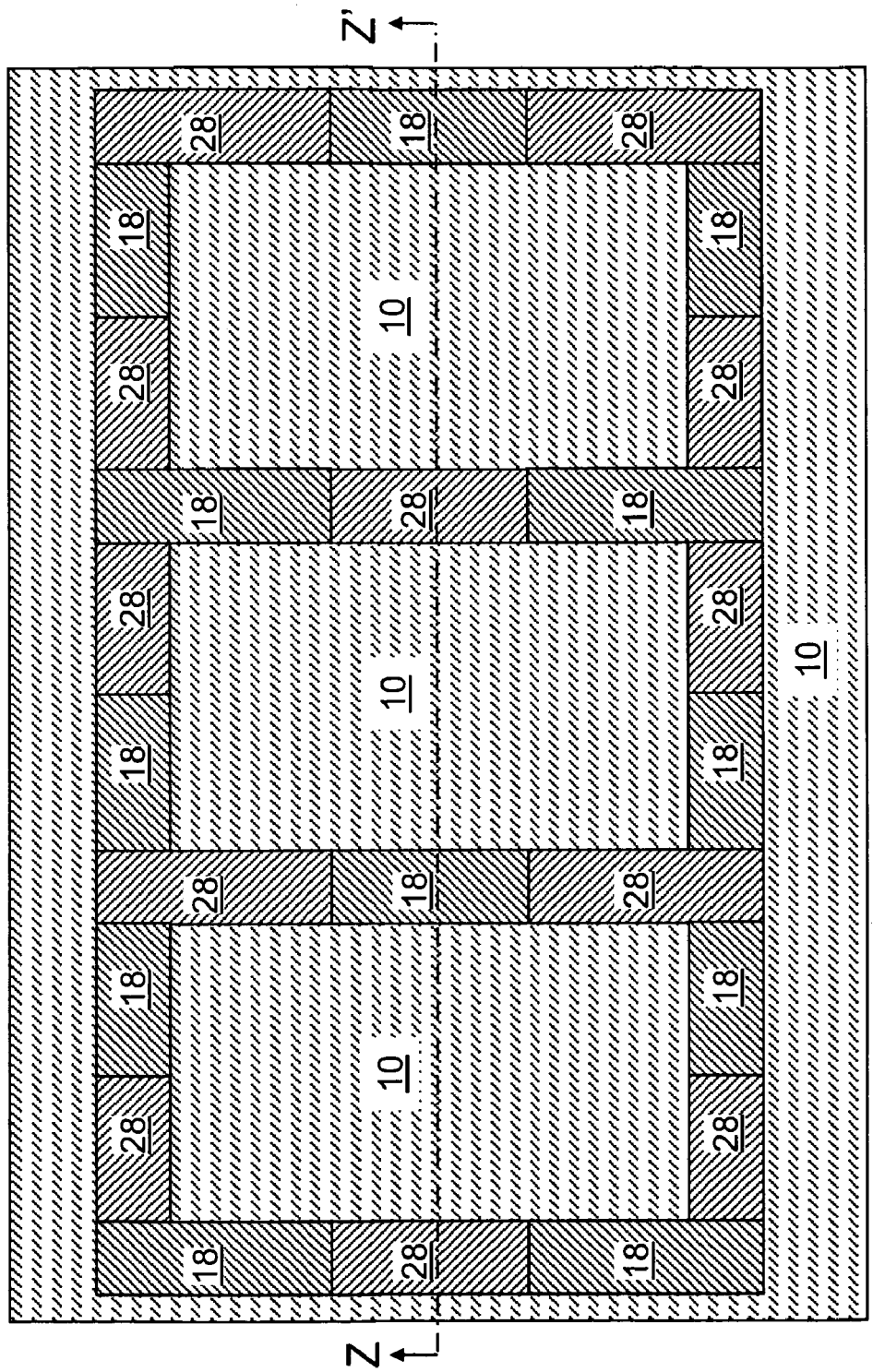

Referring to FIGS. 15 and 16, a fourth exemplary semiconductor structure according to a fourth embodiment of the present invention may be formed employing the same methods as the methods of the third embodiment. In the fourth embodiment, a plurality of first doped semiconductor regions 18 and a plurality of second doped semiconductor regions 28 laterally enclose at least one upper portion of the bottom semiconductor layer directly underneath the buried insulator layer 20. A vertical cross-sectional view along the plane Z-Z' of FIGS. 15 and 16 may look the same as FIG. 14. Each of the plurality of first doped semiconductor regions 18 laterally abuts one or more of the plurality of second doped semiconductor regions 28. A lower conductive via 57 of unitary construction may be formed to laterally surround at least one top semiconductor portion 21 therein. At least one upper conductive via 87 of the fourth embodiment replaces the at least one first upper conductive via 67 and the at least one second upper conductive via 77 of the first embodiment. The fourth exemplary semiconductor structure operates in the same manner as the first exemplary semiconductor structure.

Figure 17:
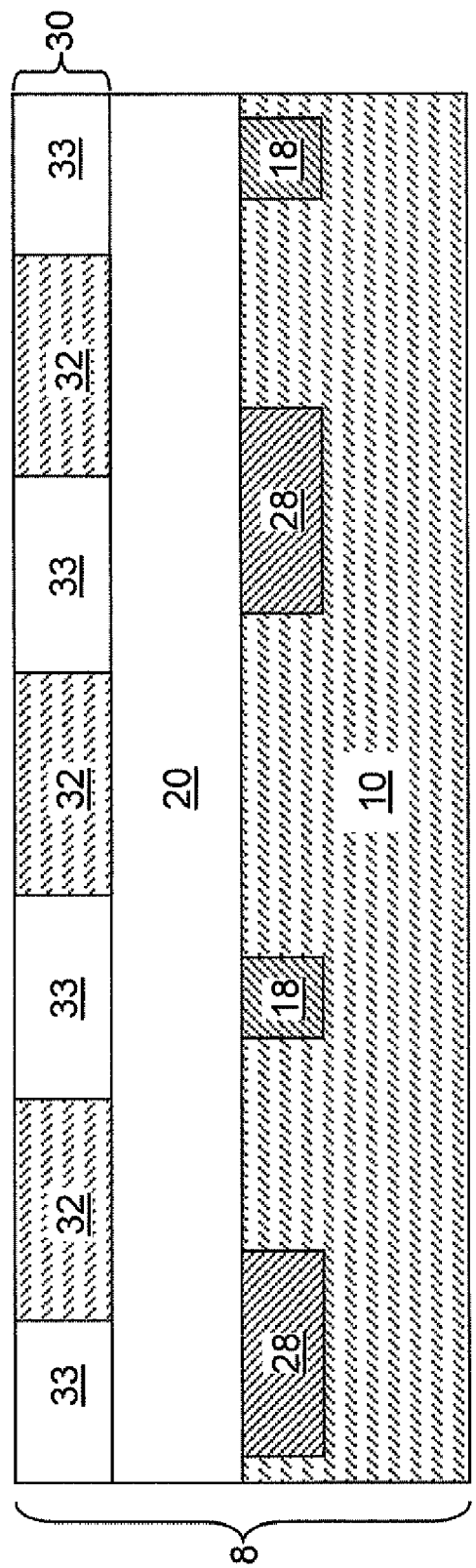
FIGS. 17 and 18 are sequential vertical cross-sectional views of a fifth exemplary semiconductor structure according to a fifth embodiment of the present invention.
Figure 18:
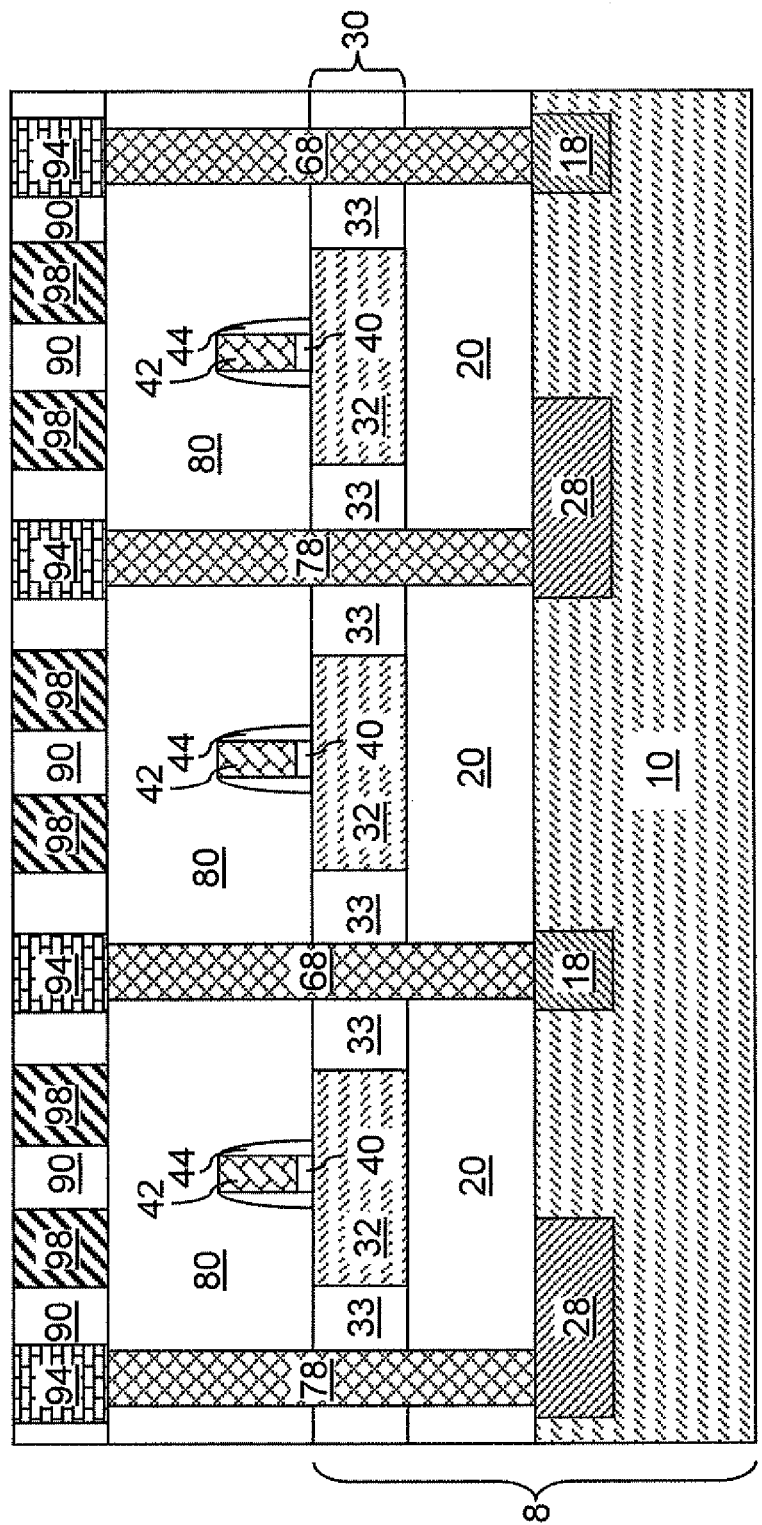

Referring to FIGS. 17 and 18, a fifth exemplary semiconductor structure according to a fifth embodiment of the present invention may be formed in the same manner as in the second embodiment of the present invention. According to the fifth embodiment, the at least one first doped semiconductor region 18 is formed so that a portion of the at least one first doped semiconductor region 18 underlies a top semiconductor portion 32. After formation of the at least one field effect transistor, a portion of each of the at least one first doped semiconductor region 18 underlies a portion of the at least one field effect transistor. In a see-through top-down view, the area of the at least one first doped semiconductor region 18 overlaps a portion of the area of the at least one top semiconductor portion 32. The fifth exemplary semiconductor structure operates in the same manner as the first exemplary semiconductor structure. Placement of the at least one first doped semiconductor region 18 underneath the at least one top semiconductor portion 32 facilitates removal of majority charge carriers during an accumulation mode from the induced charge layer that is formed in an upper portion of the bottom semiconductor layer 10 directly underneath the buried insulator layer 20.

Figure 19:
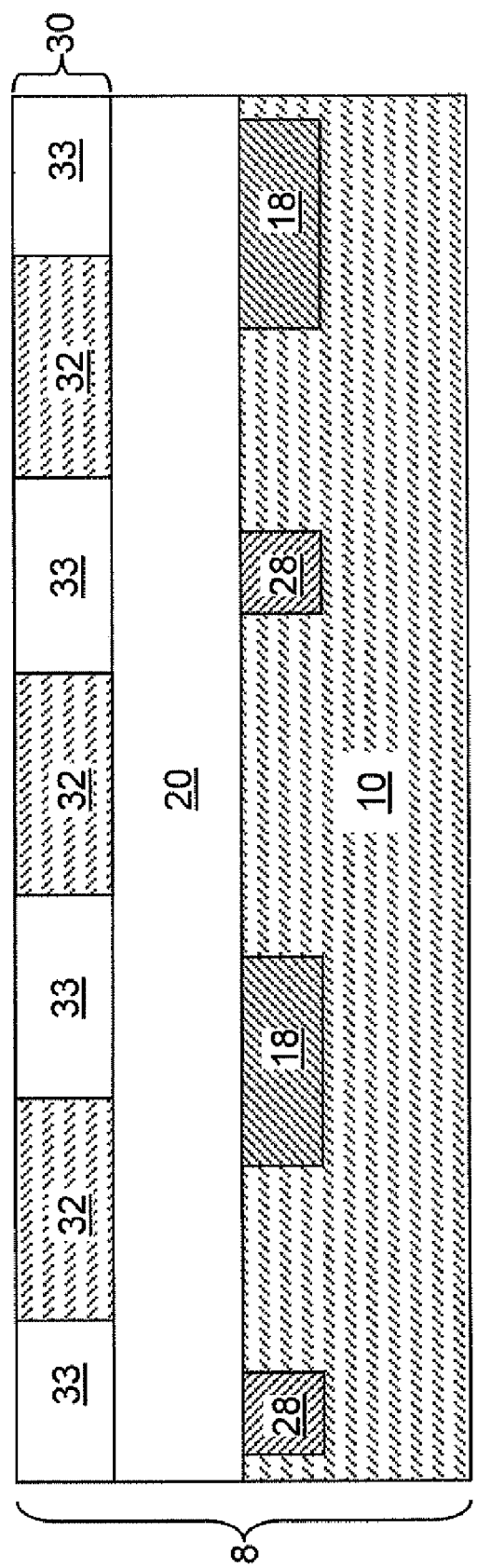
FIGS. 19 and 20 are sequential vertical cross-sectional views of a sixth exemplary semiconductor structure according to a sixth embodiment of the present invention.
Figure 20:
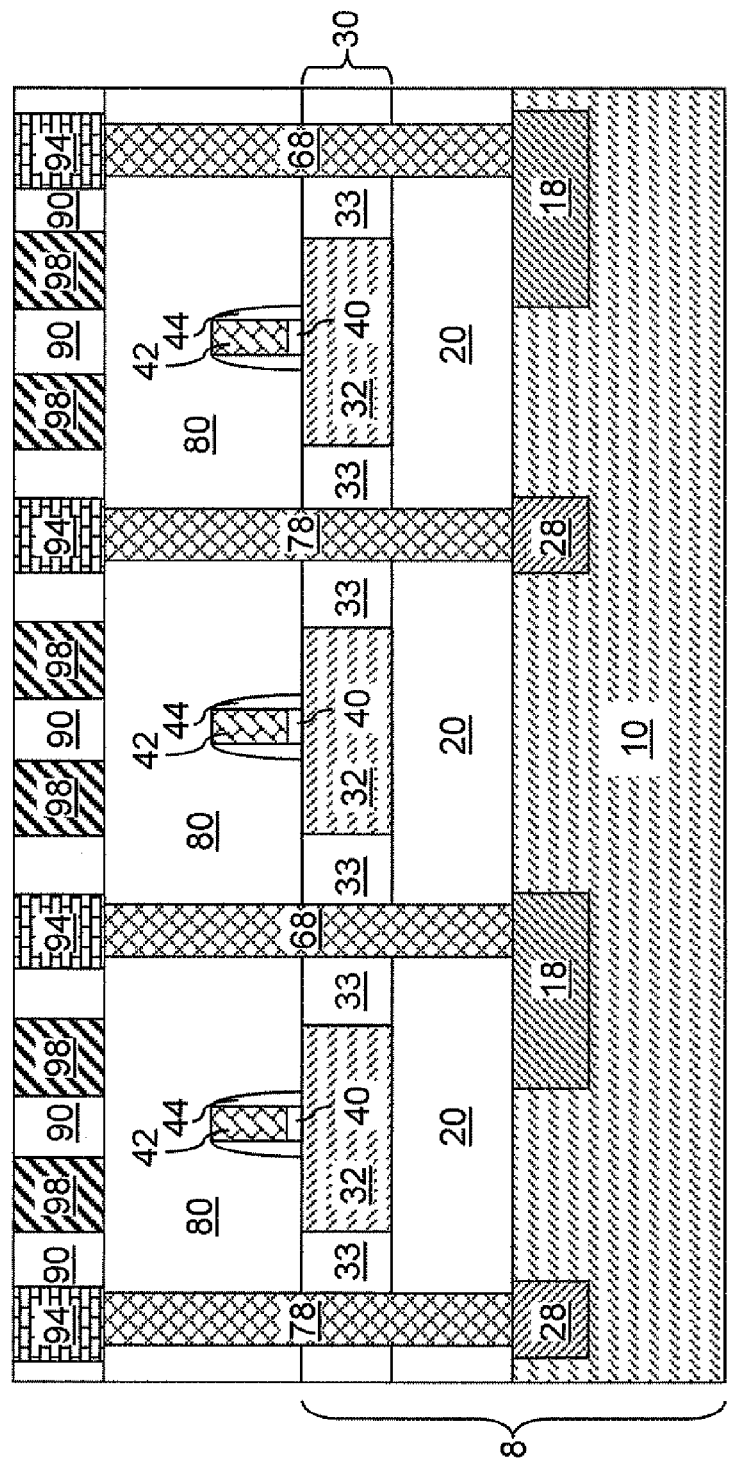

Referring to FIGS. 19 and 20, a sixth exemplary semiconductor structure according to a sixth embodiment of the present invention may be formed in the same manner as in the second embodiment of the present invention. According to the sixth embodiment, the at least one second doped semiconductor region 28 is formed so that a portion of the at least one second doped semiconductor region 28 underlies a top semiconductor portion 32. After formation of the at least one field effect transistor, a portion of each of the at least one second doped semiconductor region 28 underlies a portion of the at least one field effect transistor. In a see-through top-down view, the area of the at least one second doped semiconductor region 28 overlaps a portion of the area of the at least one top semiconductor portion 32. The sixth exemplary semiconductor structure operates in the same manner as the first exemplary semiconductor structure. Placement of the at least one second doped semiconductor region 28 underneath the at least one top semiconductor portion 32 facilitates removal of minority charge carriers during an inversion mode from the induced charge layer that is formed in an upper portion of the bottom semiconductor layer 10 directly underneath the buried insulator layer 20.

Figure 21:
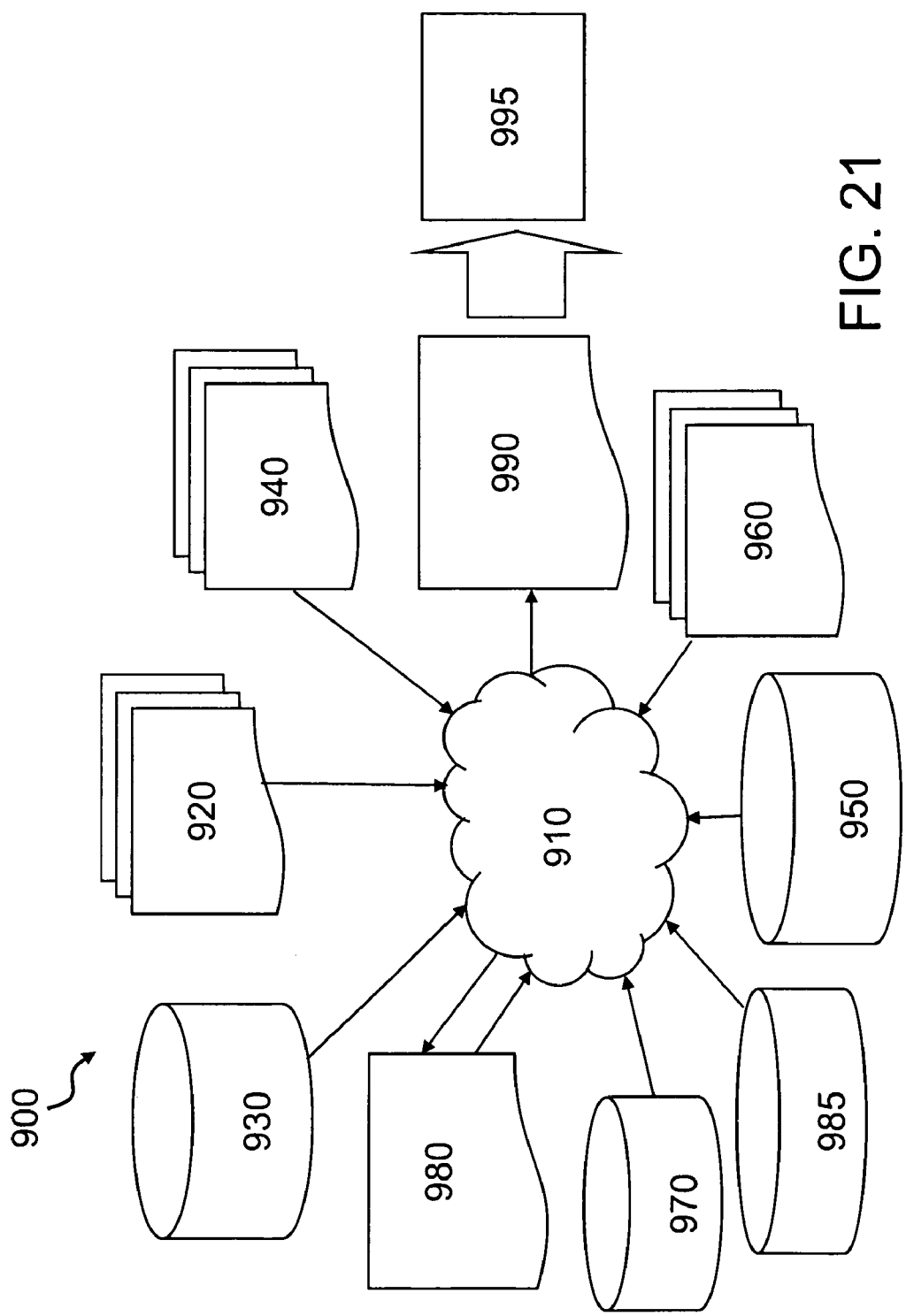
FIG. 21 is a flow diagram of a design process used in semiconductor design and manufacture of the semiconductor structures according to the present invention.

FIG. 21 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 1-20. The design structures processes and/or generated by design flow 900 may be encoded on machine-readable transmission or storage media to include data and/or instructions that, when executed or otherwise processes on a data processing system, generate a logically, structurally, mechanically, or otherwise functionally equivalent representation of hardware components, circuits, devices, or systems. Design flow 900 may vary depending on the type of representation being designed. For example, a design flow for building an application specific integrated circuit (ASIC) may differ from a design flow 900 for designing a standard component or from a design flow 900 for instantiating the design into a programmable array, for example, a programmable gate array (PGA) or a field programmable gate array (FPGA) offered by Altera® Inc. or Xilinx® Inc.

FIG. 21 illustrates multiple such design structures including an input design structure 920 that is preferably processed by design process 910. Design structure 920 may be a logical simulation design structure generated and processed by design process 910 to produce a logically equivalent functional representation of a hardware device. Design structure 920 may also, or alternately, comprise data and/or program instructions that, when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-20. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-20 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-20. In one embodiment, design structure 990 may comprise a compiled, executable HDL simulation model that functionally simulates the devices shown in FIGS. 1-20.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-20. Design structure 990 may then proceed to a stage 995 where, for example, design structure 990: proceeds to tape-out, is released to manufacturing, is released to a mask house, is sent to another design house, is sent back to the customer, etc.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a semiconductor structure comprising:
forming at least one field effect transistor on a top semiconductor layer of a semiconductor-on-insulator (SOI) substrate including a buried insulator layer and a bottom semiconductor layer having a doping of a first conductivity type;
forming a shallow trench isolation structure in said top semiconductor layer, wherein said shallow trench isolation structure laterally abuts and surrounds said at least one field effect transistor;
forming a first doped semiconductor region in said bottom semiconductor layer, wherein said first doped semiconductor region abuts said buried insulator layer and has a doping of said first conductivity type; and
forming a second doped semiconductor region in said bottom semiconductor layer, wherein said second doped semiconductor region abuts said buried insulator layer and has a doping of a second conductivity type, wherein said second conductivity type is the opposite of said first conductivity type, and wherein said first and second doped semiconductor regions are electrically connected through at least one metal interconnect structure located above said SOI substrate and configured to apply a same voltage to said first and second doped semiconductor regions.

2. The method of claim 1, further comprising:
forming a patterned ion implantation mask on said top semiconductor layer; and
implanting electrical dopants through an opening in said patterned ion implantation mask, said top semiconductor layer, and said buried insulator layer into an upper portion of said bottom semiconductor layer, wherein an implanted portion of said bottom semiconductor layer constitutes said first doped semiconductor region or said second doped semiconductor region.

3. The method of claim 1, further comprising:
forming a middle-of-line (MOL) dielectric layer over said at least one field effect transistor and said shallow trench isolation structure; and
forming at least one conductive via extending from a top surface of said MOL dielectric layer through said MOL dielectric layer, said shallow trench isolation structure, said buried insulator layer, and to said first and second doped semiconductor regions.

4. The method of claim 3, further comprising:
forming at least one first via cavity extending from said top surface of said MOL dielectric layer to said top surface of said bottom semiconductor layer; and
implanting dopants of said first conductivity type through said at least one first via cavity into an upper portion of said bottom semiconductor layer, wherein an implanted portion of said bottom semiconductor layer constitutes said first doped semiconductor region.

5. The method of claim 3, further comprising:
forming at least one via cavity extending from said top surface of said MOL dielectric layer to said top surface of said bottom semiconductor layer, wherein said first doped semiconductor region and said second doped semiconductor region are located directly underneath said at least one via cavity; and
filling said at least one via cavity with a conductive material, wherein said at least one conductive via is formed by said conductive material.

6. The method of claim 3, wherein each of said at least one conductive via is a stack of a lower conductive via and an upper conductive via, wherein an interface between said lower conductive via and said upper conductive via is substantially coplanar with a top surface of said top semiconductor layer.

7. The method of claim 3, wherein said at least one conductive via includes:
at least one first conductive via extending from a top surface of said middle-of-line (MOL) dielectric layer through said MOL dielectric layer, said shallow trench isolation structure, said buried insulator layer, and to a top surface of said first doped semiconductor region; and
at least one second conductive via extending from said top surface of a middle-of-line (MOL) dielectric layer through said MOL dielectric layer, said shallow trench isolation structure, said buried insulator layer, and to a top surface of said second doped semiconductor region.

8. A method of operating a semiconductor device comprising:
providing a semiconductor device including:
a semiconductor-on-insulator (SOI) substrate including a top semiconductor layer, a buried insulator layer, and a bottom semiconductor layer having a doping of a first conductivity type;
at least one field effect transistor located on said top semiconductor layer;
a shallow trench isolation structure laterally abutting said at least one field effect transistor;
a first doped semiconductor region embedded in said bottom semiconductor layer and abutting said buried insulator layer and having a doping of said first conductivity type; and
a second doped semiconductor region embedded in said bottom semiconductor layer and abutting said buried insulator layer and having a doping of a second conductivity type, wherein said second conductivity type is the opposite of said first conductivity type;
applying a radio frequency (RF) signal to said at least one field effect transistor, wherein an induced charge layer is formed directly underneath said buried insulator layer; and
electrically biasing said first and second doped semiconductor regions at a same voltage.

9. The method of claim 8, further comprising electrically grounding said first and second doped semiconductor regions.

10. The method of claim 9, further comprising electrically biasing said bottom semiconductor layer at another voltage, and wherein a p-n junction between said bottom semiconductor layer and said second doped semiconductor region is forward biased with a voltage difference not exceeding 0.6 V.

11. The method of claim 8, wherein said first doped semiconductor region or said second doped semiconductor region underlies a portion of said at least one field effect transistor.

12. The method of claim 8, wherein said semiconductor device further comprises at least one conductive via abutting said first doped semiconductor region and said second doped semiconductor region.

13. A semiconductor structure comprising:
a semiconductor-on-insulator (SOI) substrate including a top semiconductor layer, a buried insulator layer, and a bottom semiconductor layer having a doping of a first conductivity type;

at least one field effect transistor located on said top semiconductor layer;

a shallow trench isolation structure laterally abutting said at least one field effect transistor;

a first doped semiconductor region embedded in said bottom semiconductor layer and abutting said buried insulator layer and having a doping of said first conductivity type; and a second doped semiconductor region embedded in said bottom semiconductor layer and abutting said buried insulator layer and having a doping of a second conductivity type, wherein said second conductivity type is the opposite of said first conductivity type, and wherein said first and second doped semiconductor region are electrically biased at a same voltage.

14. The semiconductor structure of claim 13, wherein said bottom semiconductor layer is electrically biased at another voltage, and wherein a p-n junction between said bottom semiconductor layer and said second doped semiconductor region is forward biased with a voltage difference not exceeding 0.6 V.

15. The semiconductor structure of claim 13, further comprising at least one conductive via abutting said first doped semiconductor region and said second doped semiconductor region.

16. The semiconductor structure of claim 15, wherein each of said at least one conductive via is of unitary construction and extends from said top surface of said MOL dielectric layer to said top surface of said doped semiconductor region.

17. The semiconductor structure of claim 15, wherein each of said at least one conductive via comprises a vertically abutting stack of a lower conductive via and an upper conductive via, wherein a top surface of said upper conductive via extends to said top surface of said MOL dielectric layer, and a bottom surface of said lower conductive via extends to said top surface of said doped semiconductor region.

18. The semiconductor structure of claim 15, wherein said at least one conductive via comprises a contact via of unitary construction and laterally surrounding an area underlying an entirety of said at least one field effect transistor.

19. The semiconductor structure of claim 15, wherein said at least one conductive via includes:

at least one first conductive via extending from a top surface of a middle-of-line (MOL) dielectric layer through said MOL dielectric layer, said shallow trench isolation structure, said buried insulator layer, and to a top surface of said first doped semiconductor region; and at least one second conductive via extending from said top surface of a middle-of-line (MOL) dielectric layer through said MOL dielectric layer, said shallow trench isolation structure, said buried insulator layer, and to a top surface of said second doped semiconductor region.

20. The semiconductor structure of claim 15, further comprising an induced charge layer induced by a radio frequency signal applied to said at least one field effect transistor, abutting said first doped semiconductor region and said second doped semiconductor region, located in an upper portion of said bottom semiconductor layer, wherein electrical charges in said induced charge layer is drained through said at least one conductive via.

21. A non-transitory machine readable storage medium embodying a design structure for designing, manufacturing, or testing a design for a semiconductor structure, wherein said design structure comprises a netlist describing a semiconductor structure including at least one semiconductor located on a semiconductor-on-insulator substrate, said netlist comprising:

a first data representing a semiconductor-on-insulator (SOI) substrate including a top semiconductor layer, a buried insulator layer, and a bottom semiconductor layer having a doping of a first conductivity type;

a second data representing at least one field effect transistor located on said top semiconductor layer;

a third data representing a shallow trench isolation structure laterally abutting said at least one field effect transistor;

a fourth data representing a first doped semiconductor region embedded in said bottom semiconductor layer and abutting said buried insulator layer and having a doping of said first conductivity type; and a fifth data representing a second doped semiconductor region embedded in said bottom semiconductor layer and abutting said buried insulator layer and having a doping of a second conductivity type, wherein said second conductivity type is the opposite of said first conductivity type, wherein said first and second doped semiconductor region are electrically biased at a same voltage.

22. The non-transitory machine readable storage medium of claim 21, wherein said same voltage is electrical ground and wherein said bottom semiconductor layer is electrically grounded.

23. The non-transitory machine readable storage medium of claim 21, wherein said bottom semiconductor layer is electrically biased at another voltage, and wherein a p-n junction between said bottom semiconductor layer and said second doped semiconductor region is forward biased with a voltage difference not exceeding 0.6 V.

24. The non-transitory machine readable storage medium of claim 21, wherein said netlist further comprises a sixth data representing at least one conductive via abutting said first doped semiconductor region and said second doped semiconductor region.

25. The non-transitory machine readable storage medium of claim 24, wherein said sixth data includes:

a seventh data representing at least one first conductive via extending from a top surface of a middle-of-line (MOL) dielectric layer through said MOL dielectric layer, said shallow trench isolation structure, said buried insulator layer, and to a top surface of said first doped semiconductor region; and an eighth data representing at least one second conductive via extending from said top surface of a middle-of-line (MOL) dielectric layer through said MOL dielectric layer, said shallow trench isolation structure, said buried insulator layer, and to a top surface of said second doped semiconductor region.

* * * * *